(12) United States Patent
Moon et al.

(10) Patent No.: US 9,491,878 B2
(45) Date of Patent: Nov. 8, 2016

(54) ELECTRONIC DEVICE WITH PROTECTIVE CASE AND OPERATING METHOD THEREOF

(71) Applicant: Samsung Electronics Co., Ltd., Suwon-si, Gyeonggi-do (KR)

(72) Inventors: Hee-Cheul Moon, Seongnam-si (KR); Andy Kim, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 157 days.

(21) Appl. No.: 14/154,587

(22) Filed: Jan. 14, 2014

(65) Prior Publication Data

US 2014/0268517 A1 Sep. 18, 2014

(30) Foreign Application Priority Data

Mar. 14, 2013 (KR) ........................ 10-2013-0027232

(51) Int. Cl.
| | | |
|---|---|---|
| H04M 1/00 | (2006.01) | |
| H05K 7/00 | (2006.01) | |
| G06F 1/16 | (2006.01) | |
| H04B 1/3888 | (2015.01) | |
| H04M 1/02 | (2006.01) | |
| H04M 1/04 | (2006.01) | |

(52) U.S. Cl.
CPC ............... *H05K 7/00* (2013.01); *G06F 1/1677* (2013.01); *H04B 1/3888* (2013.01); *H04M 1/0214* (2013.01); *H04M 1/0245* (2013.01); *H04M 1/04* (2013.01); *G06F 2200/1634* (2013.01)

(58) Field of Classification Search
None
See application file for complete search history.

(56) References Cited

U.S. PATENT DOCUMENTS

| 5,646,649 | A | 7/1997 | Iwata et al. | |
|---|---|---|---|---|
| 2002/0137475 | A1* | 9/2002 | Shou | H04B 1/3838 455/575.8 |
| 2008/0316687 | A1 | 12/2008 | Richardson et al. | |
| 2010/0048268 | A1 | 2/2010 | O'Neill et al. | |
| 2010/0078343 | A1* | 4/2010 | Hoellwarth | B29C 45/14639 206/320 |
| 2014/0185206 | A1 | 7/2014 | Kim et al. | |

FOREIGN PATENT DOCUMENTS

| CN | 2566584 Y | 8/2003 |
|---|---|---|
| CN | 103914109 A | 7/2014 |
| CN | 203968162 U | 11/2014 |
| GB | 2 319 878 A | 6/1998 |
| KR | 20-2012-0005719 U | 8/2012 |
| KR | 10-2012-0137929 A | 12/2012 |
| WO | 2012/036711 A1 | 3/2012 |

* cited by examiner

*Primary Examiner* — Erika Washington
(74) *Attorney, Agent, or Firm* — Jefferson IP Law, LLP

(57) ABSTRACT

An electronic device is provided. The electronic device includes a connector detachable from part of an electronic device including a display, and a cover connected to the connector, wherein the cover is capable of covering at least part of the display of the electronic device, and wherein the cover includes a window configured to expose the at least part of the display when the cover covers at least part of the display.

12 Claims, 26 Drawing Sheets

ELECTRONIC DEVICE WITH PROTECTIVE CASE AND OPERATING METHOD THEREOF

CROSS-REFERENCE TO RELATED APPLICATION(S)

This application claims the benefit under 35 U.S.C. §119(a) of a Korean patent application filed on Mar. 14, 2013 in the Korean Intellectual Property Office and assigned Serial No. 10-2013-0027232, the entire disclosure of which is hereby incorporated by reference.

TECHNICAL FIELD

The present disclosure relates to an electronic device. More particularly, the present disclosure relates to an electronic device including a protective case and an operating method thereof.

BACKGROUND

In recent, as multimedia technology advances, electronic devices having various functions are emerging. Such electronic devices mostly include a convergence function for fulfilling one or more functions in combination.

Further, a mobile terminal, that may be referred to as smart phone, is dominant among the electronic devices. Particularly, the mobile terminal includes a large-screen touch display module and a high-resolution camera module in addition to including a basic communication function for communicating with other terminals, and thus, the mobile terminal may capture a still image and a moving picture. Also, the mobile terminal can play multimedia contents, such as music and video, and may surf the web, i.e. may access the internet, by accessing a network. As such, the mobile terminal including a high-performance processor may perform various convergence functions more rapidly such that the major communication function with the other terminal is regarded as the additional function.

Users who purchase the electronic device, such as the smart phone, may cover the electronic device with a separate protective case in order to protect an exterior of the electronic device in use and to optimize a grip of the electronic device. The protective case may be formed of a material of excellent texture. A folder-type protective case exposes a display module, e.g., a touch screen, of the electronic device by uncovering the protective case. When not in use, the electronic device is protected by covering the display module. However, such a protective case often is designed for the electronic device protection and does not serve other functions.

The above information is presented as background information only to assist with an understanding of the present disclosure. No determination has been made, and no assertion is made, as to whether any of the above might be applicable as prior art with regard to the present disclosure.

SUMMARY

Aspects of the present disclosure are to address at least the above-mentioned problems and/or disadvantages and to provide at least the advantages described below. Accordingly, an aspect of the present disclosure is to provide an electronic device including a protective case for providing various functions and an operating method thereof.

Another aspect of the present disclosure is to provide an electronic device including a protective case for obtaining status information of the electronic device even when it is covered, and an operating method thereof.

Yet another aspect of the present disclosure is to provide an electronic device including a protective case for controlling the electronic device even when it is covered, and an operating method thereof.

In accordance with an aspect of the present disclosure, an apparatus is provided. The apparatus includes a connector detachable from part of an electronic device including a display, and a cover connected to the connector, wherein the cover is capable of covering at least part of the display of the electronic device, and wherein the cover includes a window configured to expose the at least part of the display when the cover covers at least part of the display.

In accordance with another aspect of the present disclosure, an electronic device is provided. The electronic device includes an external housing including a display, a connector detachably connected to part of the housing, and a cover coupled to the connector, wherein the cover is configured to close or open with respect to the display, and wherein the cover includes a window configured to expose at least part of the display when the cover covers the display.

In accordance with another aspect of the present disclosure, an electronic device is provided. The electronic device includes a body including a display, and a processor embedded in the body, wherein the processor is configured to provide a user interface only in part of the display when an object outside the body approaches or covers at least part of the display.

In accordance with another aspect of the present disclosure, an electronic device is provided. The electronic device includes an electronic device body including a display, a rear cover detachable from the body, a front cover capable of folding with the rear cover and configured to cover at least part of the display, a linking part configured to interconnect the front cover and the rear cover, and a window in the front cover, wherein the front cover includes an inner layer configured to form a face for contacting the display, and a plate interposed between the inner layer and an outer layer.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which.

Throughout the drawings, like reference numerals will be understood to refer to like parts, components and structures.

DETAILED DESCRIPTION

Figure 1:
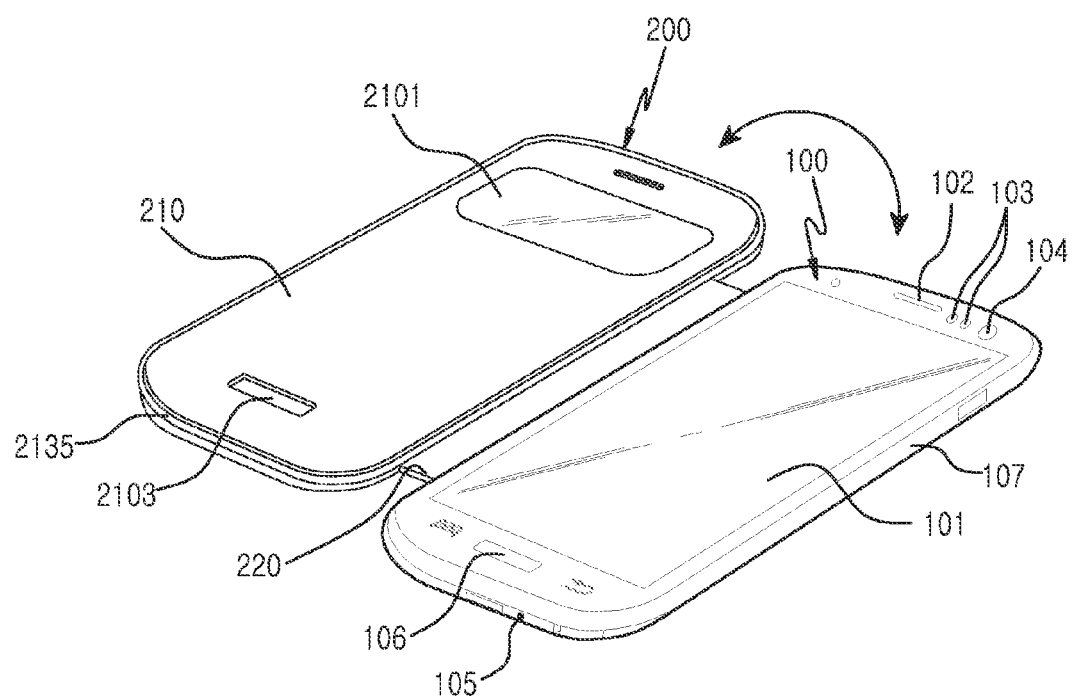
FIG. 1 is a perspective view of an electronic device including a protective case according to an embodiment of the present disclosure.

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

By the term "substantially" it is meant that the recited characteristic, parameter, or value need not be achieved exactly, but that deviations or variations, including for example, tolerances, measurement error, measurement accuracy limitations and other factors known to those of skill in the art, may occur in amounts that do not preclude the effect the characteristic was intended to provide.

Various embodiments of the present disclosure provide an electronic device including a touch screen for performing an input operation through an input device and a display operation through a display part on a single physical touch screen. Herein, the term "display part" may be replaced by the term "display". Although the display part and the input device are separated in the electronic device according to various embodiments of the present disclosure, the display part may include the input device or the input device may be referred to as the display part. In addition, the display part can be referred to as a touch screen and/or a touch screen device.

Various embodiments of the present disclosure are not limited to the electronic device including the touch screen but are applicable to various electronic devices. For example, the present disclosure can be applied to the electronic device which physically separates or divides the display part and the input device.

Various embodiments of the present disclosure provide, but not limited to, the electronic device including the touch screen as the display part and employing a protective case. For example, the electronic device can employ various devices including the touch screen, that is, a Personal Digital Assistant (PDA), a laptop computer, a mobile phone, a smart phone, a netbook, a Mobile Internet Device (MID), a Personal Computer (PC), an Ultra Mobile PC (UMPC), a tablet PC, a laptop PC, a navigation device, and an electronic music player, an electronic book reader, or any other similar and/or suitable type of electronic device.

Figure 2:
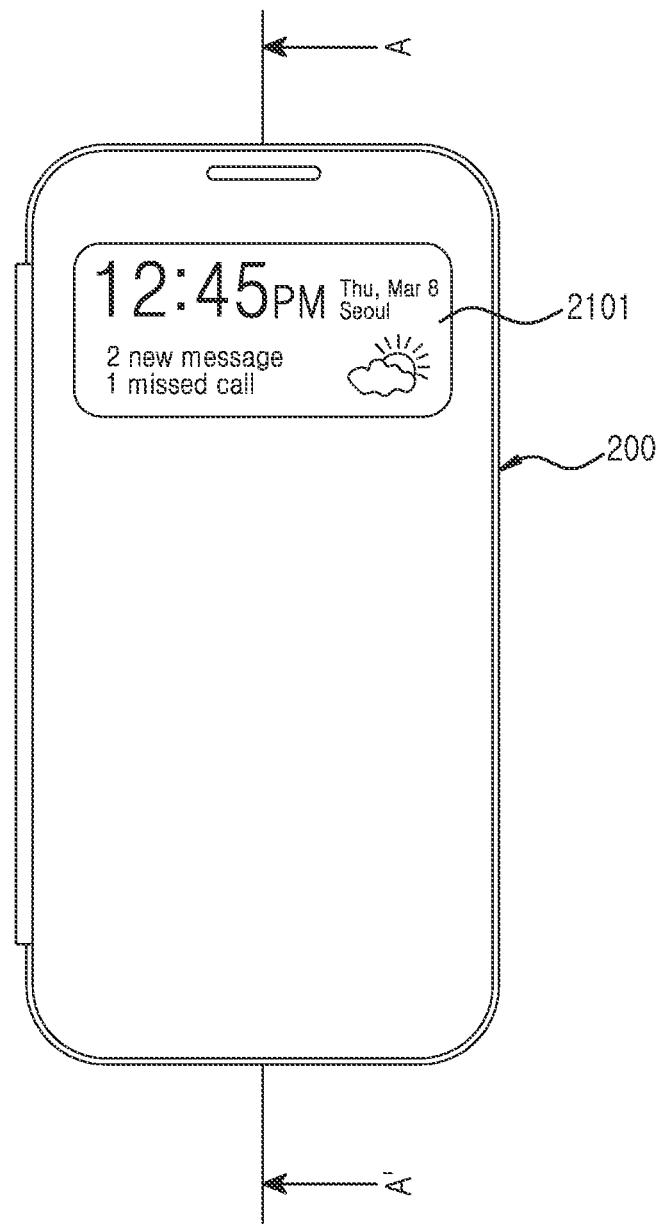
FIG. 2 is a plan view of a protective case of FIG. 1 with a front cover closed according to an embodiment of the present disclosure.
Figure 3:
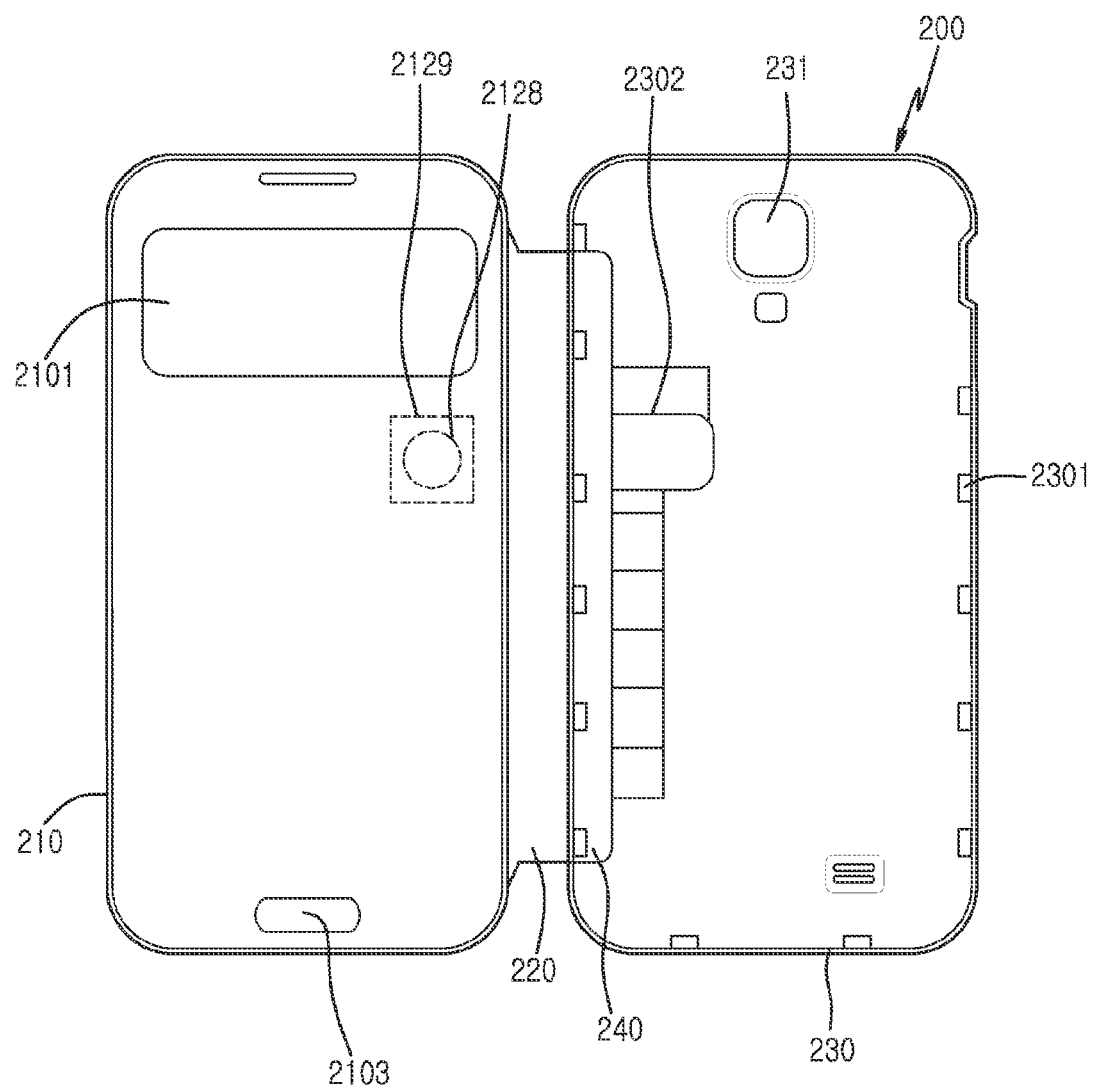
FIG. 3 is a plan view of a protective case of FIG. 1 with an electronic device removed according to an embodiment of the present disclosure.

FIG. 1 is a perspective view of an electronic device including a protective case according to an embodiment of the present disclosure, FIG. 2 is a plan view of a protective case of FIG. 1 with a front cover closed according to an embodiment of the present disclosure, and FIG. 3 is a plan view of a protective case of FIG. 1 with an electronic device removed according to an embodiment of the present disclosure.

Referring to FIGS. 1, 2 and 3, an electronic device 100, which is covered and/or protected by a protective case 200, includes, but is not limited to, a touch screen 101, a speaker module 102 disposed at the top of the touch screen 101, a plurality of sensors 103 disposed at one side of the speaker module 102, a camera module 104 disposed at one side of the sensors 103, and a microphone 105 disposed at a bottom of the touch screen 101. However, the present disclosure is not limited thereto, and the electronic device 100 can further include other components in addition to the components shown in FIG. 1, and the electronic device 100 can have a different arrangement of the components shown in FIG. 1. One or more of the components, excluding the touch screen, can be omitted.

For example, the electronic device 100 is a folder type or a flip type, and the electronic device 100 can be protected by the protective case 200 that is connected and/or attached to the electronic device 100. The protective case 200 may operate as a sliding type. The protective case 200 can include a rear cover 230 (see FIG. 3) for supporting a rear side of the electronic device 100, a front cover 210 for protecting a front side of the electronic device 100, and a linking part 220 integrally connected to and extended from the front cover 210 and connected to the rear cover 230.

The rear cover 230 can be disposed to support the rear side of the electronic device 100. The front cover 210 can be connected to the rear cover 230 by the linking part 220 in order to rotate the front cover 210 along an arrow of FIG. 1. Hence, the front cover 210 can be disposed on the front side of the touch screen 101 to protect the touch screen 101 of the electronic device 100 as shown in FIG. 2, or may be disposed to be used on the electronic device 100 as shown in FIG. 1.

Herein, when the front cover 210 rotates based on the rear cover 230 in order to meet the touch screen 101 of the electronic device 100, the front cover 210 may be referred to as being closed, and when the front cover 210 rotates based on the rear cover 230 in order to facilitate the direct touch on the touch screen 101 of the electronic device 100, as shown in FIG. 1, the front cover 210 may be referred to as being open.

When a transparent window 2101 is disposed on the protective case 200 and the front cover 210 is closed, a user can see part of the touch screen 101 of the electronic device 100 with the naked eyes. The electronic device 100 detects the closed front cover 210 and displays status information of the electronic device 100 on a region of the touch screen 101 corresponding to the transparent window 2101, as shown in FIG. 2. Hence, the user can use the electronic device 100 through the transparent window 2101 even when the front cover 210 is closed.

In various embodiments of the present disclosure, but not limited to, the single transparent window 2101 is disposed in the upper portion of the front cover 210. For example, a plurality of transparent windows may be disposed at different positions of the front cover 210 in order to display the information according to an operating method of the electronic device 100. For example, the transparent window 2101 may have an area not exceeding 50% of the entirety of the area of the front cover 210. Alternatively, one or more transparent windows can have the area occupying about 5%, 10%, 15%, 20%, 25%, 30%, 35%, 40%, 45%, 50%, 55%, 60%, 65%, 70%, 75%, 80%, 85%, 90%, 95%, or 100%, or any other similar and/or suitable percentage of the display area. Alternatively, the display area of the transparent window may be selected from a range, e.g., about 20~50%, 30~60%, 40~80%, or any other similar and/or suitable range between two arbitrary values of the above-stated percentages as a maximum value and a minimum value.

One or more button receiving grooves 2103 may be formed on a surface contacting the touch screen 101 of the front cover 210 in order to prevent a key button 106, which protrudes from the electronic device 100, from being arbitrarily pressed by the closed front cover 210. A step 2135, which may also be referred to as a physical step and/or ledge, is formed on a periphery of the face contacting the touch screen 101 of the front cover 210. When the front cover 210 is closed, the user can easily open the front cover 210 by lifting up the step 2135 with his/her nail or any other similar and/or suitable implement.

The front cover 210 is formed in, but is not limited to, the same size as the touch screen 101 of the electronic device 100, as shown in FIG. 1. For example, the front cover 210 may extend and bend its end part to protect up to a side 107 of the electronic device 100 when the front cover 210 is closed. The front cover 210, the linking part 220, and the rear cover 230 of the protective case 200 can be constructed to correspond to various key buttons of the electronic device 100, the protruded or depressed components, and the components to be penetrated. The protective case 200 may be water-proof.

A plurality of tension protrusions 2301 (see FIG. 3) can be formed at particular intervals along an inner periphery of the rear cover 230. The tension protrusions 2301 can be detachably assembled to be received in a corresponding tension groove (not shown) on the rear side of the electronic device 100.

The rear cover 230 can be formed of, but is not limited to, a synthetic resin material. For example, the rear cover 230 can be formed of various materials, but is not limited to, metal material, Glass Fiber (GF) Reinforced Polymer (GFRP), Carbon Fiber Reinforced Polymer (CFRP), rubber, silicon, Polycarbonate (PC), PC Acrylonitrile Butadiene Styrene (ABS), PC GF, or any other similar and/or suitable type of material. The rear cover 230 can be formed as, but is not limited to, a battery cover which is directly assembled to the rear side of the electronic device 100. For example, the rear cover 230 may be molded separately from the electronic device 100 in order to receive the rear side of the electronic device 100.

According to various embodiments of the present disclosure, an opening 231 (see FIG. 3) can be formed in the rear cover 230. The opening 231 may expose the component disposed in the rear side of the electronic device 100, for example, the camera module. In this case, various accessories such as an effect filter and a white balance gray card may be applied to an interior or an exterior of the rear cover 230 through the opening 231.

According to various embodiments of the present disclosure, a magnet 2128 is disposed in the front cover 210, and an element configured to detect a magnetic force, such as a capacitor or other electronic and/or non-electronic element, can be disposed at a corresponding position of the electronic device 100 in order to detect magnetic force of the magnet 2128. The magnetic force detecting element can be disposed at a position of the electronic device 100 in order to detect the magnetic force of the magnet 2128 when the front cover 210 is closed so as to contact the display 101 of the electronic device 100. The magnetic force detecting element can employ, but is not limited to, a Hall sensor and a reed switch for detecting the magnetic force of the magnet 2128.

According to various embodiments of the present disclosure, by virtue of flexibility of the linking part 220 interconnecting the front cover 210 and the rear cover 230, the front cover 210 can move to cover the rear cover 230 of the electronic device 210 from behind, like the cover direction of the display 101 of the electronic device 100. Thus, even when the front cover 210 is not closed and the rear cover 230 is covered from behind by virtue of the magnetic force of the magnet 2128 of the front cover 210, the electronic device 100 can recognize that the front cover 210 is closed. In this regard, shielding units 2302 and 2129 can be configured to not allow detection of the magnetic force of the magnet 2128 when the front cover 210 is rotated to cover the rear cover 230.

Referring to FIG. 3, when the front cover 210 is moved to cover the rear cover 230, then the shielding unit 2302 can be disposed at a position of the rear cover 230 corresponding to the magnet 2128 of the front cover 210. Additionally, a coupler 240 is included in the protective case 200. The shielding unit 2302 can be formed of various materials having a shield layer which can block the magnetic force of the magnet 2128. For example, the shielding unit 2302 can be formed of a sheet-type shield disposed at the corresponding position of the rear cover 230. When the shielding unit 2302 is the sheet type, a single sheet can be formed to a thickness of 0.2 mm or any other similar and/or suitable thickness. For example, the shielding unit 2302 can stack a plurality of sheets. Four sheets of the thickness 0.05 mm may be stacked. For example, the material of the shielding unit 2302 can use various alloys having magnetic permeability such as iron (Fe)-based alloy (amorphous), a nickel (Ni)-based alloy, and a cobalt (Co)-based alloy.

When a magnetic force generating element, for producing the magnetic force, employs a magnet, an electromagnet using direct current (DC), a solenoid, or a power line for generating a DC magnetic field, the shielding unit for shielding the magnetic force can use a magnetic material, such as Fe, Co, and Ni, or a magnetic alloy in order to shield the magnetic force by detouring a magnetic force line. The magnetic force may be shielded by generating the magnetic field of the same magnitude in an opposite direction of the magnetic field generated by the magnet, the electromagnet using DC, the solenoid, or the power line for generating the DC magnetic force.

When the magnetic force generating element for producing the magnetic force employs an electromagnet, a solenoid, or a power line using alternating current (AC) for generating an AC magnetic field, the shielding unit may employ a conductor to cancel and/or nullify the magnetic force using the magnetic field generated by an eddy current flowing on a conductor surface according to the AC magnetic field. The shielding unit 2129 can be further disposed at a position overlapping with a region of the magnet 2128 of the front cover 210, as shown in FIG. 3. The shielding unit 2129 can be disposed so as to detect the magnetic force of the magnet 2128 only when the front cover 210 is moved to cover the electronic device 100. The shielding unit 2129 may be interposed between the magnet 2128 and an outer layer 211 (see FIG. 4A) of the front cover 210 based on the magnet 2128. The shielding units 2302 and 2129 may be disposed selectively in the front cover 210 or the rear cover 2302, or at both of the corresponding positions of the front cover 210 and the rear cover 2302.

Figure 4A:
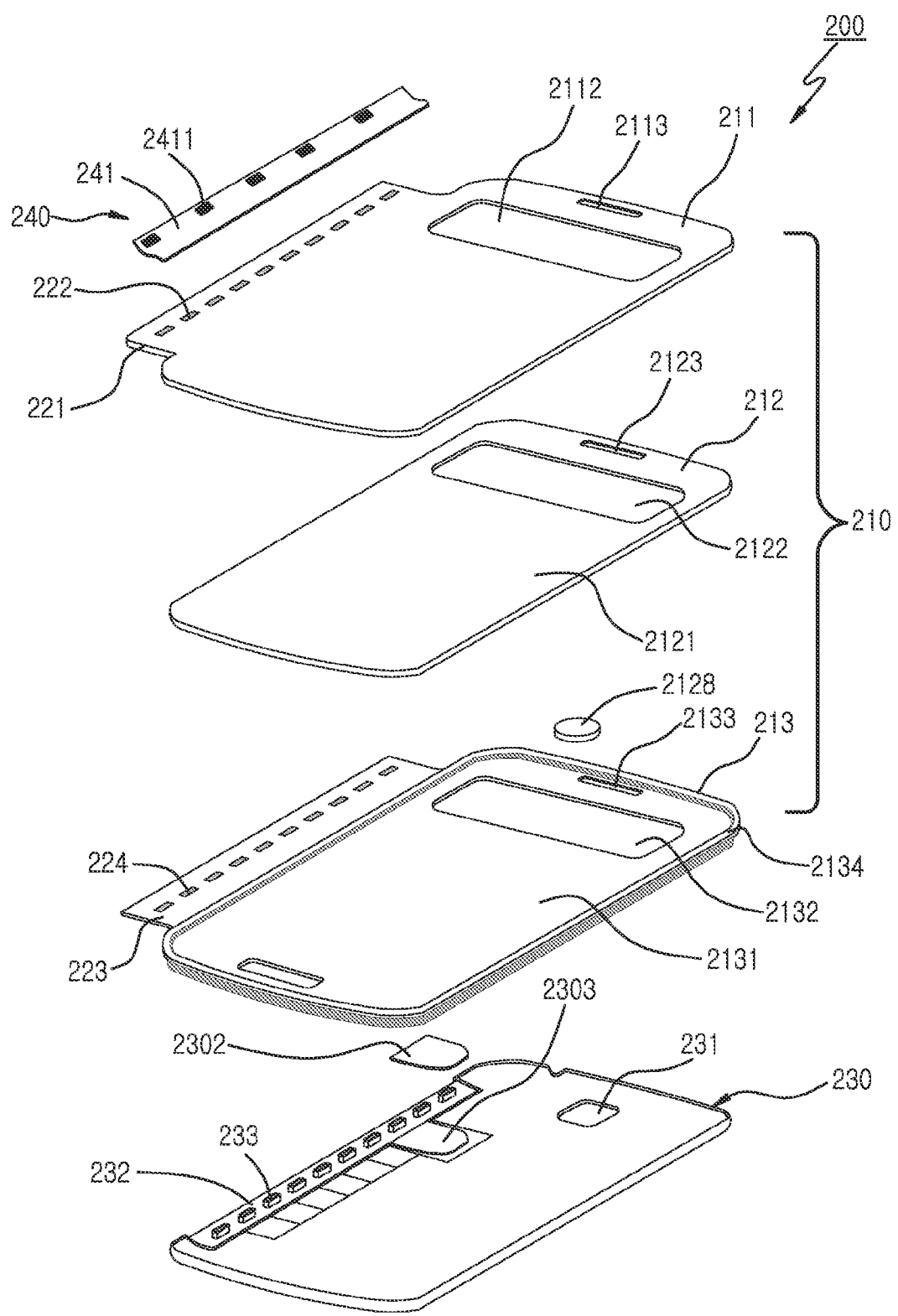
FIG. 4A is an exploded perspective view of a protective case of FIG. 1 according to an embodiment of the present disclosure.
Figure 4B:
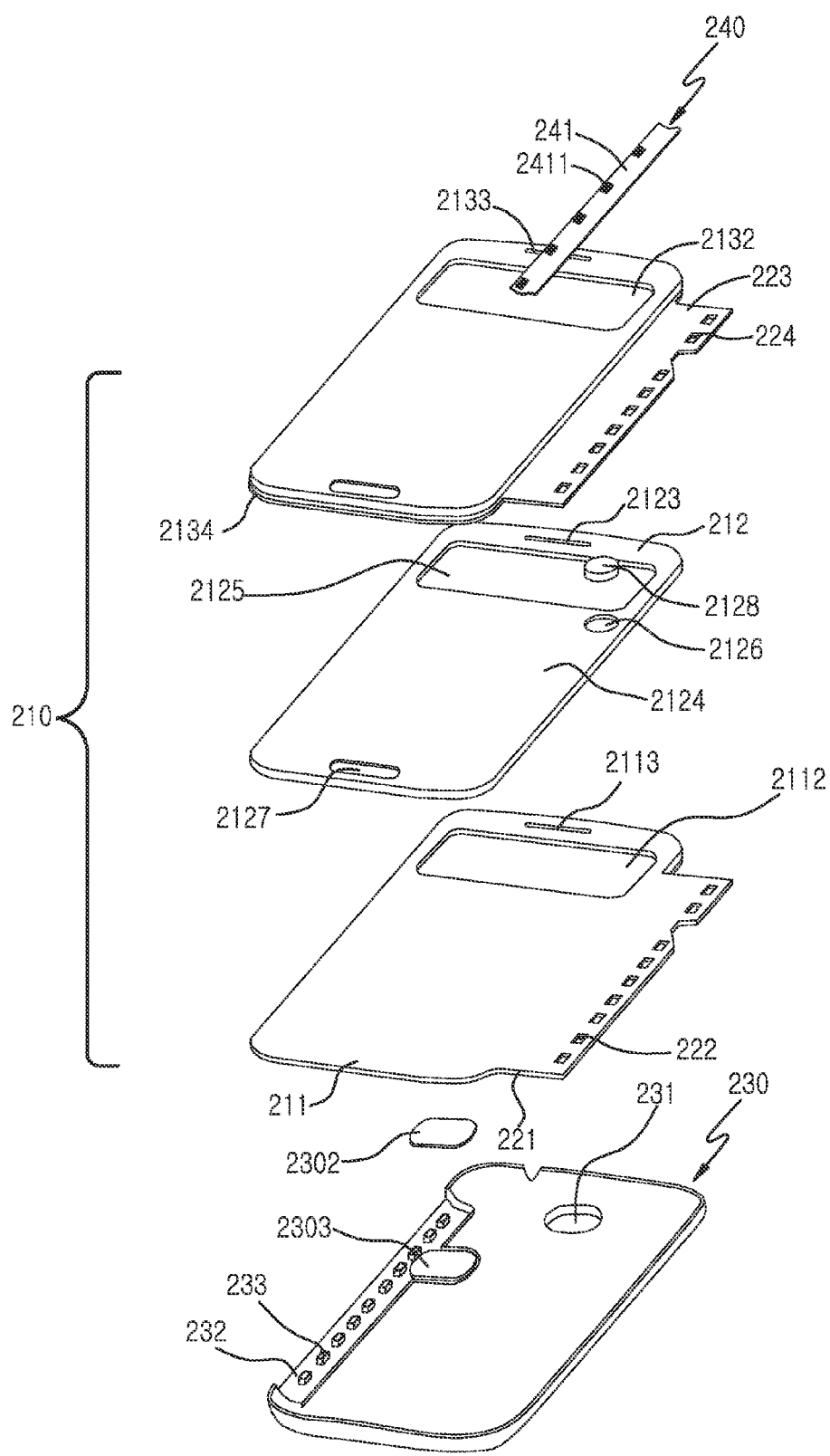
FIG. 4B is an exploded perspective view of a protective case of FIG. 1 viewed from a different angle according to an embodiment of the present disclosure.
Figure 5:
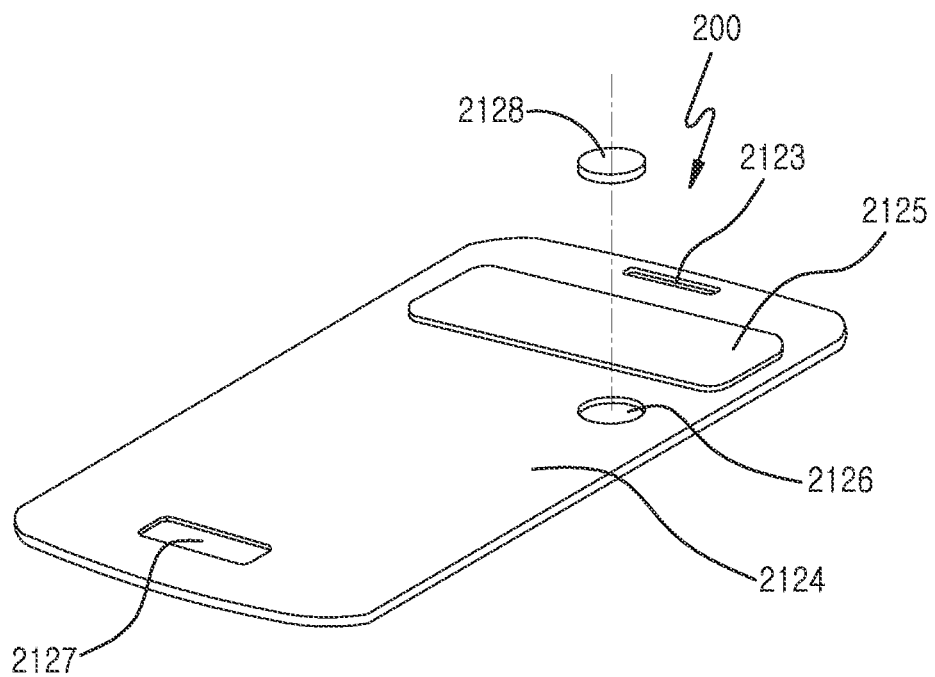
FIG. 5 is a perspective view of another side of a reinforcement plate of FIGS. 4A and 4B according to an embodiment of the present disclosure.
Figure 6:
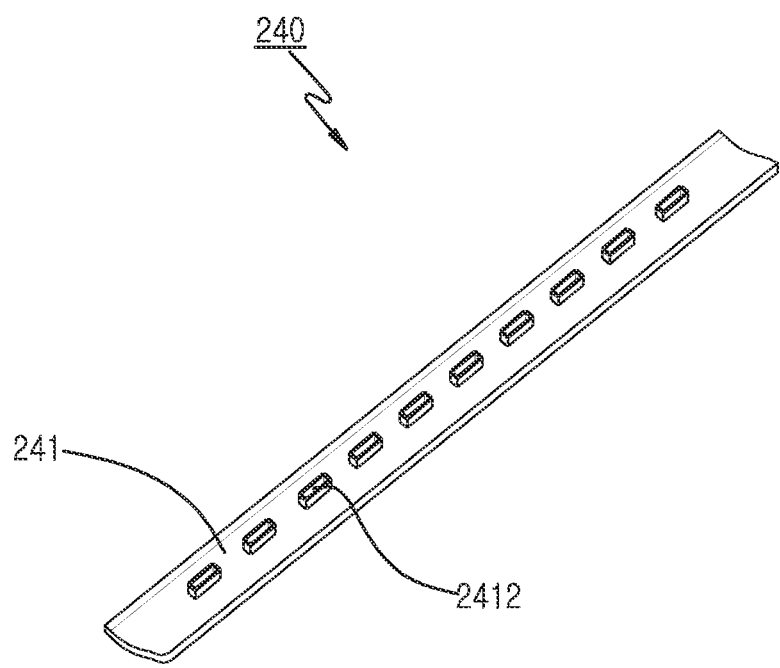
FIG. 6 is a perspective view of another side of a coupler of FIGS. 4A and 4B according to an embodiment of the present disclosure.
Figure 7:
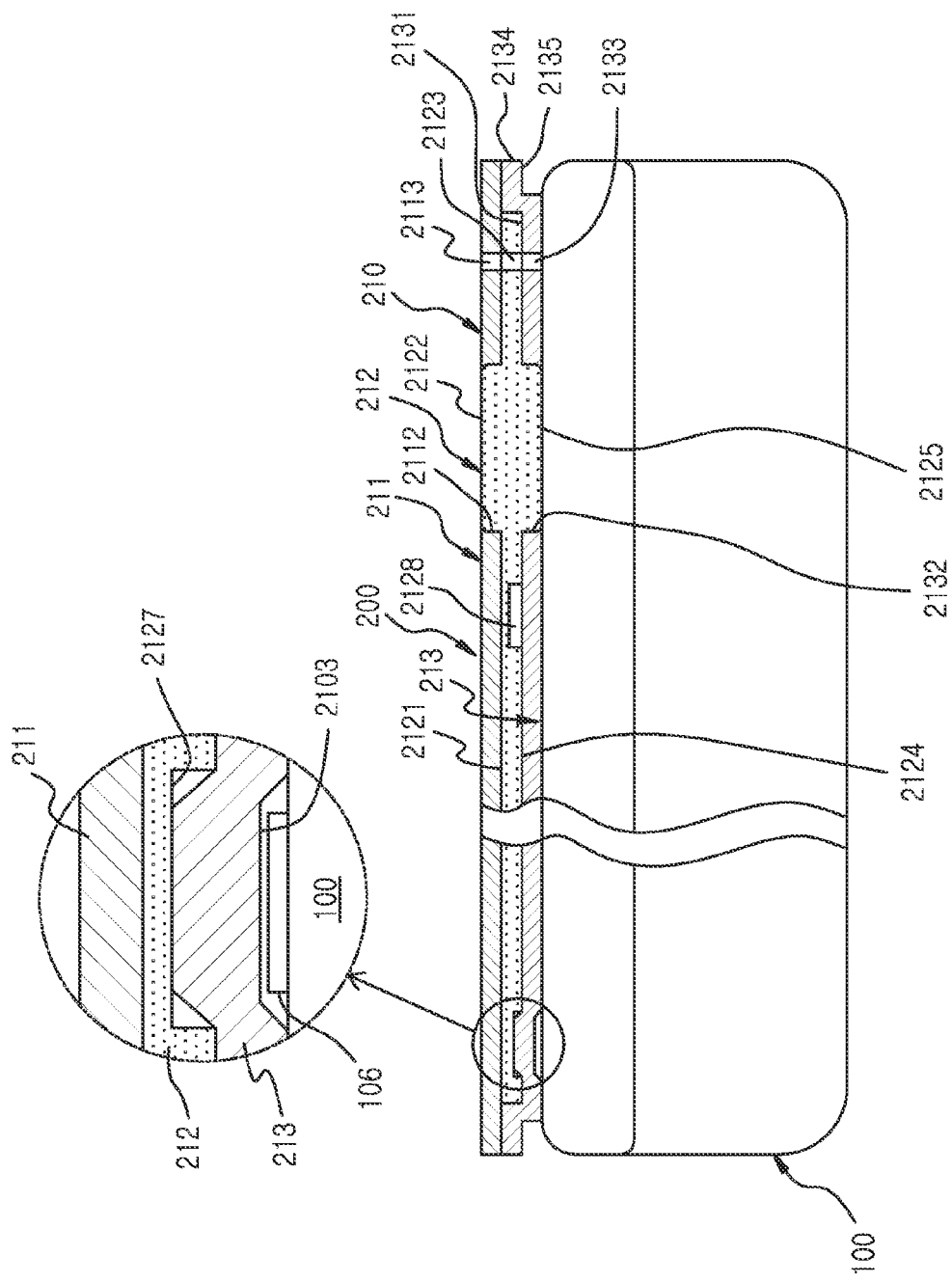
FIG. 7 is a cross-sectional view of a connected protective case of FIGS. 4A and 4B according to an embodiment of the present disclosure.

FIG. 4A is an exploded perspective view of a protective case of FIG. 1 according to an embodiment of the present disclosure, FIG. 4B is an exploded perspective view of a protective case of FIG. 1 viewed from a different angle according to an embodiment of the present disclosure, FIG. 5 is a perspective view of another side of a reinforcement plate of FIGS. 4A and 4B according to an embodiment of the present disclosure, FIG. 6 is a perspective view of another side of a coupler of FIGS. 4A and 4B according to an embodiment of the present disclosure, and FIG. 7 is a cross-sectional view of a connected protective case of FIGS. 4A and 4B according to an embodiment of the present disclosure.

Referring to FIG. 4A, an exploded perspective view of the protective case when the front cover is closed is shown, and referring to FIG. 4B an exploded perspective view of the protective case when the front cover is open is shown.

Referring to FIGS. 4A and 4B, the front cover 210 includes an inner layer 213 contacting the touch screen 101 of the electronic device 100, an outer layer 211 stacked on the inner layer 213, and a reinforcement plate 212 is interposed between the inner layer 213 and the outer layer 211. The outer layer 211 and the inner layer 213 can be formed of various materials, for example, but not limited to, leather, synthetic leather, wool, CFRP, GFRP, PC, glass, and sapphire. The outer layer 211 and the inner layer 213 may be formed of a metal and may go through various surface treatments, such as coating. The reinforcement plate 212 can be formed of various transparent materials, for example, but not limited to, acrylic, epoxy, CFRP, GFRP, PC, conductive material, glass, and sapphire.

The outer layer 211 and the inner layer 213 can be assembled so as not to expose the interposed reinforcement plate 212 to the outside. Accordingly, the inner layer 213 includes a seating part 2131 for mounting the reinforcement plate 212. Hence, a periphery 2134 of the seating part 2131 can be higher than the face of the seating part 2131. Naturally, the periphery of the face of the inner layer 213 contacting the touch screen 101 of the electronic device 100 can form the step 2135 (see FIG. 7).

The outer layer 211 can include a first opening 2112 at the corresponding position so as to expose a first window 2122 protruding from a first face 2121 of the reinforcement plate 212, and the seating part 2131 of the inner layer 213 can include a second opening 2132 at the corresponding position so as to expose a second window 2125 (see FIG. 4B) protruding from a second face 2124 (see FIG. 4B) of the reinforcement plate 212.

The corresponding positions of the outer layer 211, the inner layer 213, and the reinforcement plate 212 can include first, second, and third outlets 2113, 2133, and 2123 for emitting speaker sound from the speaker module 102 of the electronic device 100 when the front cover 210 is closed. Notably, an outer layer linking part 221 of the outer layer 211 and an inner layer linking part 223 of the inner layer 213 can be coupled to form the linking part 220 of FIG. 1. The outer layer linking part 221 includes a first through hole 222 at regular intervals, and the inner layer linking part 223 also includes a second through hole 224 at regular intervals. When the outer layer 211 and the inner layer 213 are assembled, the through holes 222 and 224 can serve as a single through hole at the corresponding positions. Additionally, the reinforcement plate 212 includes a groove 2127, Referring to FIG. 5, the second window 2125 can protrude from the second face 2124 of the reinforcement plate 212 that is contacting the seating part 2131 of the inner layer 213. A magnet mounting groove 2126 can be formed at a proper position of the second face 2124 to mount the magnet 2128. While the magnet mounting groove 2126 is circular in FIG. 5, the magnet mounting groove 2126 can be formed in a shape corresponding to various shapes of the magnet 2128. While the magnet 2128 is disposed in the second face 2124 of the reinforcement plate 212 contacting the inner layer 213, the magnet 2128 can be disposed at a position of the first face 2121 of the reinforcement plate 212 contacting the outer layer 211. In this case, the magnet mounting groove 2126 can be formed in the first face 2121 of the reinforcement plate 212.

The magnet 2128 can be detected by a detecting element of the electronic device 100 when the front cover 210 of the protective case 200 is closed. In this case, the detecting element disposed at the corresponding position of the electronic device 100 can use the Hall sensor or the reed switch for detecting the magnetic force of the magnet 2128.

As shown in FIG. 4B, the rear cover 230 may include a coupler mounting part 232 including mounting protrusions 233, as well as a shielding unit mounting groove 2303 for mounting a shielding unit 2302. As shown in FIG. 6, the coupler 240 may include a plate part 241 and a plurality of insertion protrusions 2412 protruding from the plate part 241.

FIG. 7 is a cross-sectional view of connected protective case of FIGS. 4A and 4B according to an embodiment of the present disclosure.

Referring to FIG. 7, the groove 2127 of a certain depth can be formed in the second face 2124 of the reinforcement plate 212. The groove 2127 can be formed at a position corresponding to the key button 106 protruding from the face of the electronic device 100 contacting the front cover 210 when the front cover 210 of the protective case 200 is closed. The groove 2127 can guide to form the button receiving groove 2103 of FIG. 1 by sinking the position of the inner layer 213 corresponding to the key button 106 of the electronic device 100 when the inner layer 213 and the reinforcement plate 212 are assembled. Even when the front cover 210 of the protective case 200 is closed, the button receiving groove 2103 receives the key button 106 of the electronic device 100 in order to prevent the key button 106 from being arbitrarily pressed.

The reinforcement plate 212 can include the first window 2122 and the second window 2125, as non-process parts, which are exposed through the first and second openings 2112 and 2132 of the outer layer 211 and the inner layer 213 and serve as the transparent window 2101 of FIG. 1. Also, the reinforcement plate 212 can include, the first and second faces 2121 and 2124 contacting the outer layer 211 and the inner layer 213 as process parts. The process parts can be processed to reinforce adhesion between the outer layer 211 and the inner layer 213.

The reinforcement plate 212 is interposed between the inner layer 213 and the outer layer 211 and then, but not limited to, thermal compression can be applied along the periphery. The inner layer 213 and the outer layer 211 can be assembled using bonding with an adhesive. When the inner layer 213 and the outer layer 211 are thermal-compressed, the periphery of the outer layer 211 and the periphery 2134, excluding the seating part 2131 of the inner layer 213, are assembled in direct contact. Thus, the exposure of the reinforcement plate 212 due to long-term usage can be addressed. As shown in FIGS. 4A through 6, the coupler 240 includes the plate part 241 having a length and a width to be mounted in the coupler mounting part 232 of the rear cover 230, and the plurality of insertion protrusions 2412 protruding from the plate part 241 and to be mounted in mounting protrusions 233, which protrude from the coupler mounting part 232 at regular intervals. Hence, when the coupler 240 is mounted to the coupler mounting part 232 of the rear cover 230, it is advantageous that an upper side of the plate part 241 of the coupler 240 matches an inner side of the rear cover 230. Hence, the tensions protrusions 2411 can be formed at regular intervals on the other side of the insertion protrusions 2412 of the plate part 241 and assembled with an elastic groove disposed on the rear side of the electronic device. The coupler 240 can employ PC, PC_ABS, PC_GF, and the like.

When the outer layer 211 and the inner layer 213, with the reinforcement plate 212 interposed in between them, are thermal-compressed, then the first through holes 222 of the outer layer linking part 221 and the second through holes 224 of the inner layer linking part 223 correspond to each other so as to form final through holes. Temporary assembly is processed in a manner that the mounting protrusions 233 of the coupler mounting part 232 of the rear cover 230 penetrate the through holes and the coupler 240 is assembled above them. Thus, the front cover 210 and the rear cover 230 are connected. In so doing, the mounting protrusion 233 includes a mounting groove, and the assembly can finished by inserting the insertion protrusions 2412 of the coupler 240 into the mounting grooves.

Referring to FIG. 4B, the rear cover 230 can include the shielding unit mounting groove 2303 for mounting the shielding unit 2302. The shielding unit 2302 can be securely bonded or adhered to the rear cover 230. The shielding unit 2302 is disposed at the corresponding position of the rear cover 230 to prevent the magnetic force of the magnet 2128 of the front cover 210 from being detected from behind the electronic device 100.

Figure 8A:
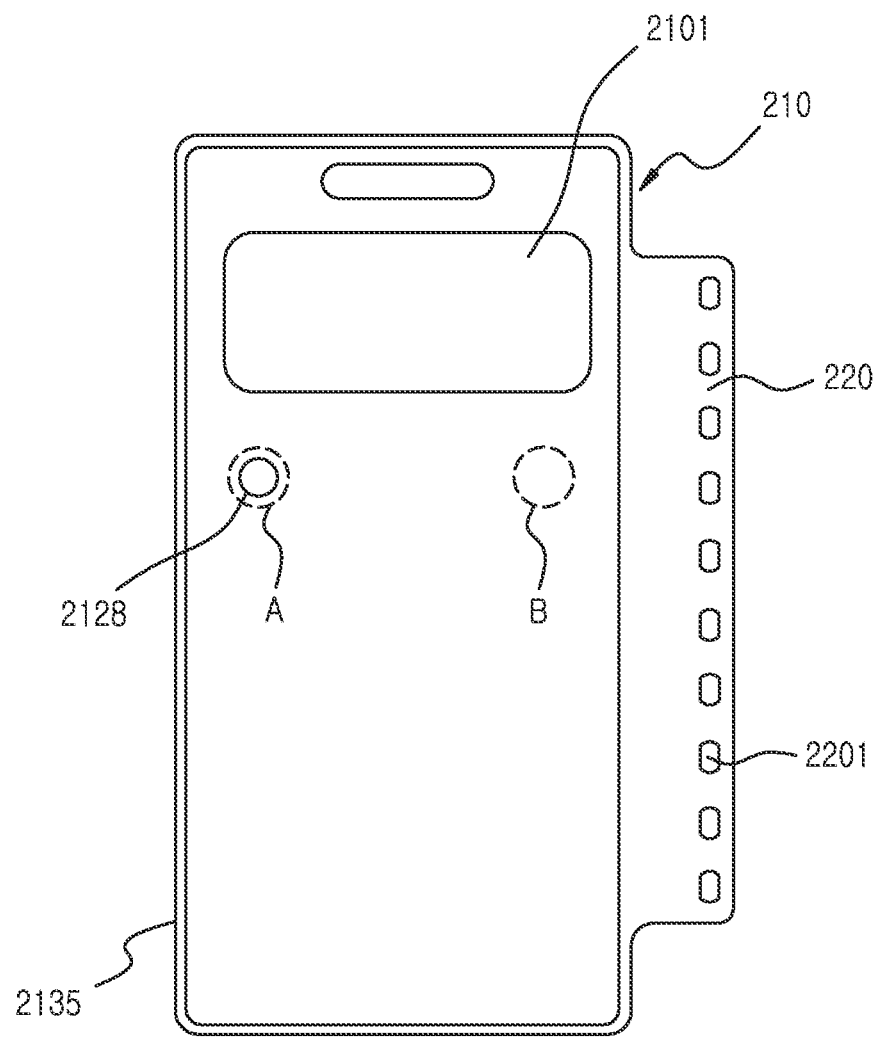
FIGS. 8A and 8B are diagrams of opening and closing of a front cover of a protective case according to a position of a magnet according to an embodiment of the present disclosure.
Figure 8B:
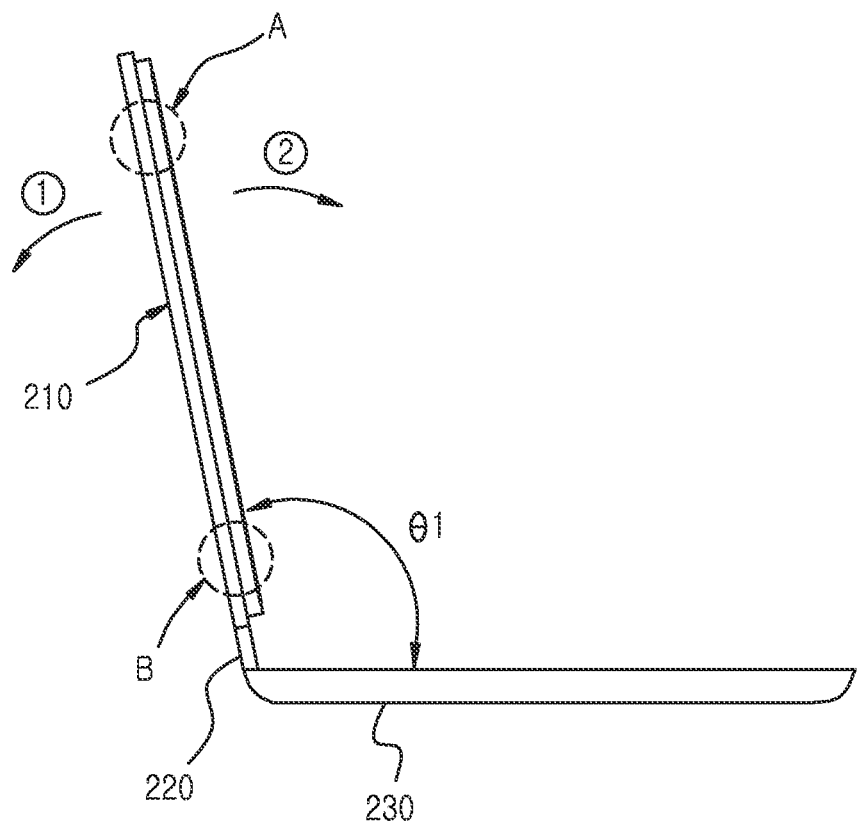

FIGS. 8A and 8B are diagrams of the opening and the closing of the front cover of a protective case according to a position of a magnet according to an embodiment of the present disclosure.

Referring to FIGS. 8A and 8B, the position of the magnet 2128 disposed in the front cover 210 can determine a bend angle between an opening direction and a close direction of the front cover 210. For example, based on the bend angle θ, the front cover 210 can freely rotate to open, e.g. move in the direction ① of FIG. 8B, or to close, e.g. move in the direction ② of FIG. 8B, as shown in FIG. 8B.

According to the position of the magnet 2128 based on the bend angle θ, the bend angle, tension, stiffness, and flexibility may be controlled in accordance with an open/close direction of the front cover 210. For example, when the magnet 2128 is disposed in a region A away from the linking part 220, the front cover 210 can be opened and closed faster based on the bend angle θ, than when the magnet 2128 is disposed in a region B of the front cover 210. The bend angle may change a little according to the position of the magnet 2128. That is, the bend angle can be adjusted by using the magnet 2128 as a weight and defining its position.

FIGS. 9A through 9D are diagrams of various linking parts of a protective case according to an embodiment of the present disclosure.

Referring to FIGS. 9A through 9D, the bend angle, the tension and an open/close speed of the front cover 210 can be controlled using the linking part 220 of the protective front cover 210. The front cover 210 may be easily opened and closed by operating the front cover 210 to open or to close.

Figure 9A:
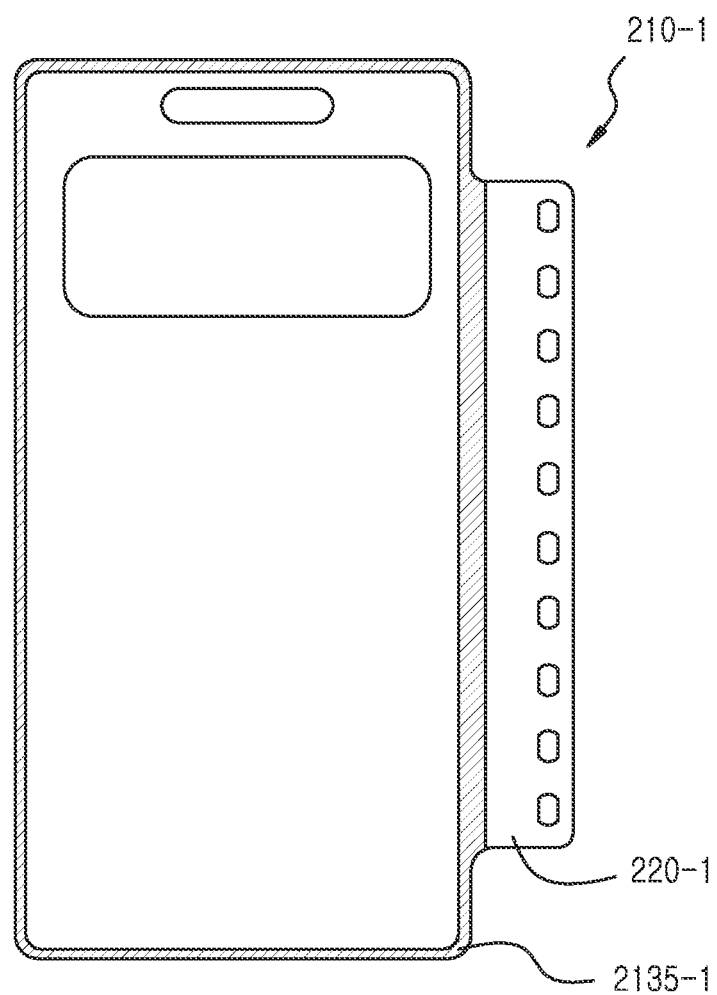
FIGS. 9A. 9B, 9C, and 9D are diagrams of various linking parts of a protective case according to an embodiment of the present disclosure.
Figure 9B:
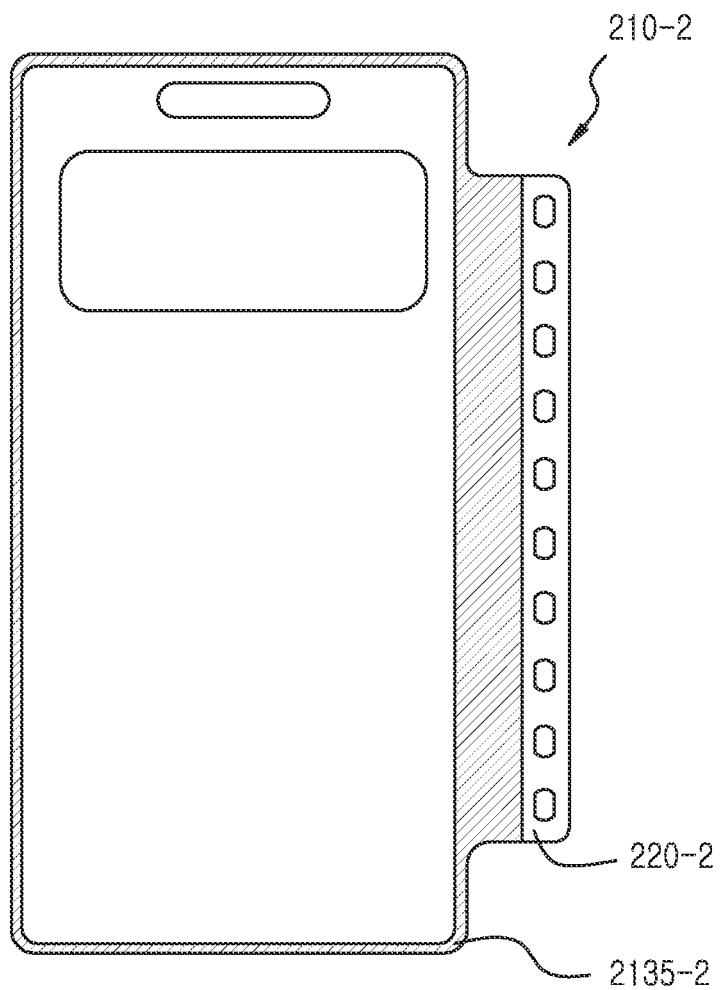

Referring to FIG. 9A, the open/close direction of a front cover 210-1 can be guided by expanding a thermal-compression region 2135-1 up to part of a linking part 220-1 of the front cover 210-1. Compared to FIG. 9A, the open/close direction of a front cover 210-2, as shown in FIG. 9B, can be guided by further expanding a thermal-compression region 2135-2 of a front cover 210-2. For example, the bend angle, the tension, the stiffness, and the flexibility based on the open/close direction of the front cover 210-1 and 210-2 may be controlled by respectively adjusting the thermal-compression region 2135-1 and 2135-2 of the linking part 220-1 and 220-2.

Figure 9C:
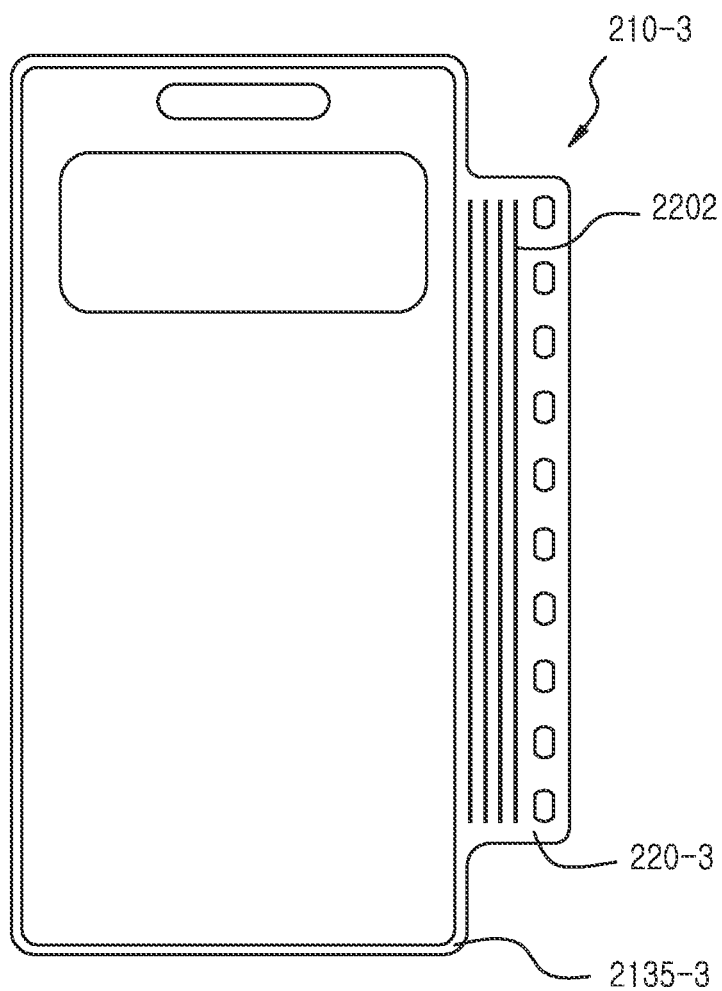
Figure 9D:
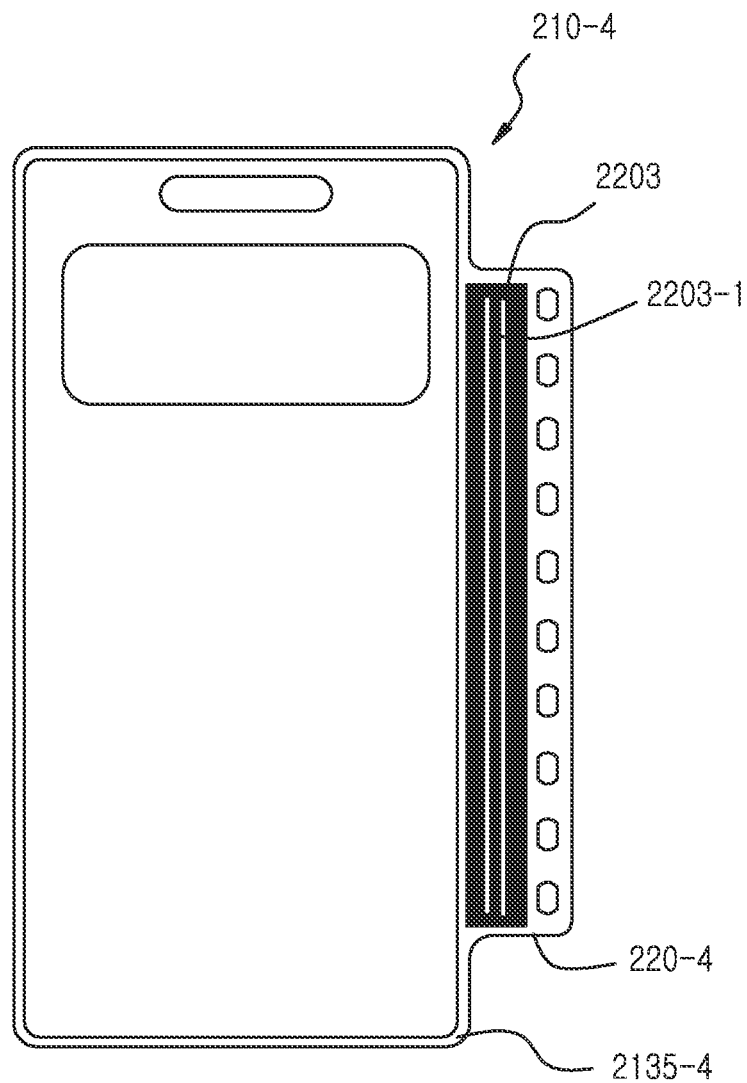

As shown in FIGS. 9C and 9D, the bend angle, the tension, the stiffness, and the flexibility based on the open/close direction of front covers 210-3 and 210-4 may be controlled by interposing materials 2202 and 2203 in respective linking parts 220-3 and 2204.

In FIG. 9C, a plurality of materials 2202 may be disposed at regular intervals in the linking part 220-3 of the front cover 210-3 that includes a thermal-compression region 2135-3, or, as shown in FIG. 9D, a single material 2203 may be disposed in the linking part 220-4 by forming a plurality of slits 2203-1 at regular intervals of the front cover 210-4 that includes a thermal-compression region 2135-4.

Figure 10:
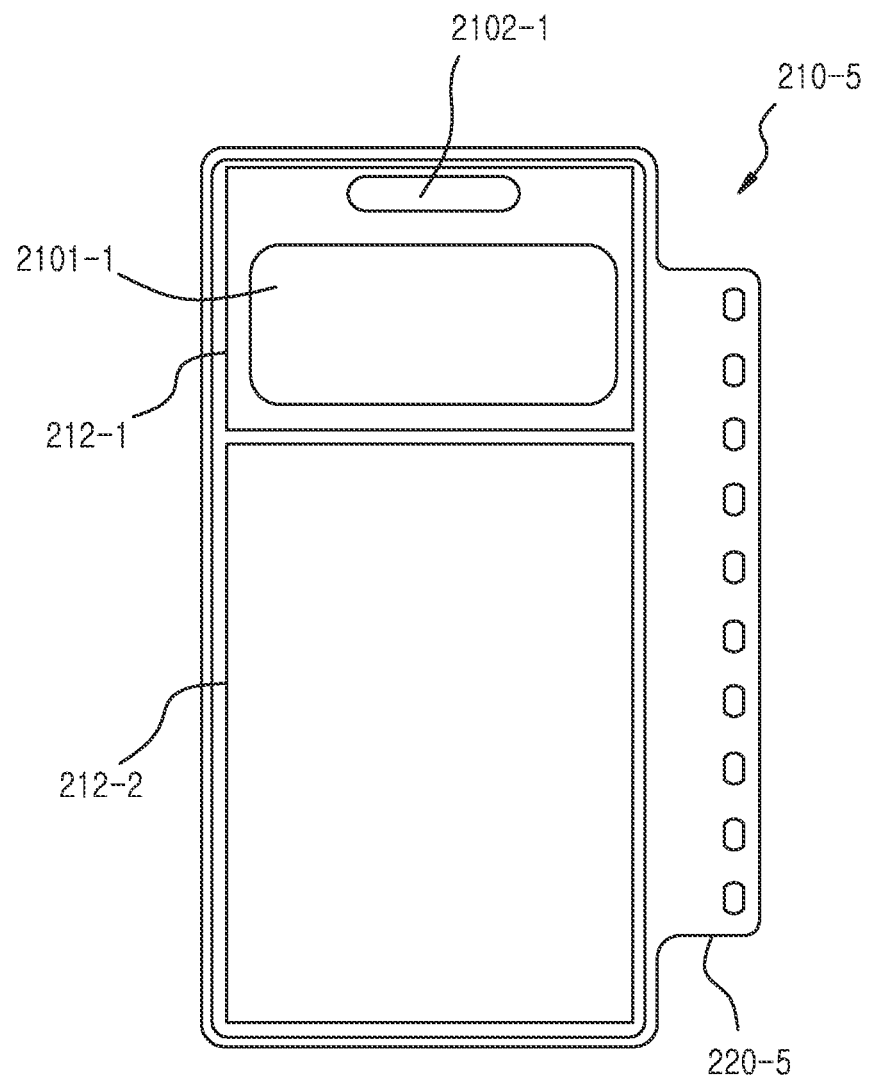
FIG. 10 is a diagram of a reinforcement plate according to an embodiment of the present disclosure.

FIG. 10 is a diagram of a reinforcement plate according to an embodiment of the present disclosure.

Referring to FIG. 10, two reinforcement plates 212-1 and 212-2 can be embedded in the front cover 210-5 including the outer layer and the inner layer. The first reinforcement plate 212-1 can include a transparent window 2101-1 to be exposed to the outer layer and the inner layer, and the second reinforcement plate 212-2 can be disposed at the lower portion not to be exposed between the outer layer and the inner layer. In this case, the first reinforcement plate 212-1 is not processed for the transparent window 2101, and the second reinforcement plate 212-2 is processed to reinforce the adhesion of the outer layer and the inner layer. Thus, the problem that the non-processed part and the processed part of the single reinforcement plate are processed together can be addressed.

Herein, the reference numeral 220-5 is the linking part and the reference numeral 2102-1 is the speaker sound outlet.

FIGS. 11A through 11E are diagrams of various covers according to an embodiment of the present disclosure.

Referring to FIGS. 11A through 11E, while the components of the outer layer, the inner layer, and the reinforcement plate are given different reference numerals to ease the understanding, they are substantially the same as the inner layer, the outer layer, and the reinforcement plate of the cover as aforementioned and only the transparent window differs.

Figure 11A:
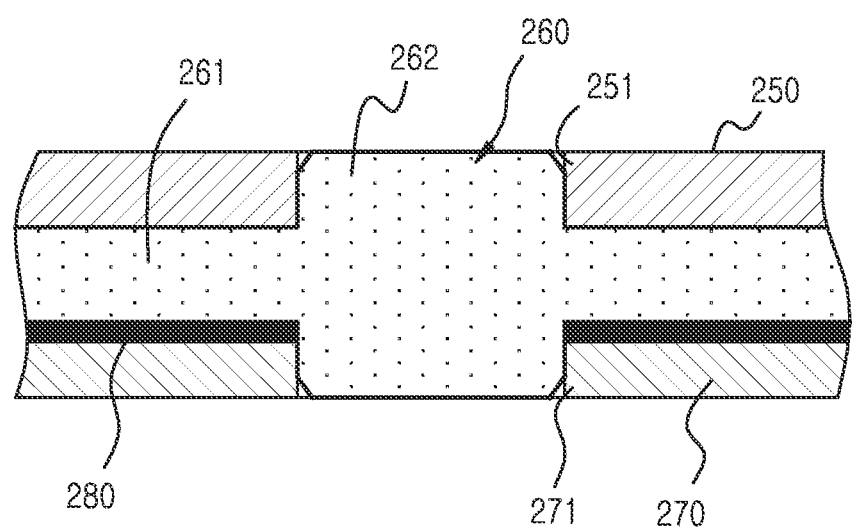
FIGS. 11A, 11B, 11C, 11D, and 11E are diagrams of various covers according to an embodiment of the present disclosure.

Referring to FIG. 11A, a reinforcement plate 260 can be interposed between an outer layer 250 and an inner layer 270. The reinforcement plate 260 includes a window 262 exposed through an outer layer opening 251 of the outer layer 250 and an inner layer opening 271 of the inner layer 270, and a bonding layer 261 for bonding the outer layer 250 and the inner layer 270. In this embodiment, an auxiliary plate 280 is interposed between the inner layer 270 and the reinforcement plate 260. The auxiliary plate 280 can assist the reinforcement plate 260, particularly, which includes a flexible part such as transparent acrylic. The auxiliary plate 280 can employ GFRP or CFRP.

Figure 11B:
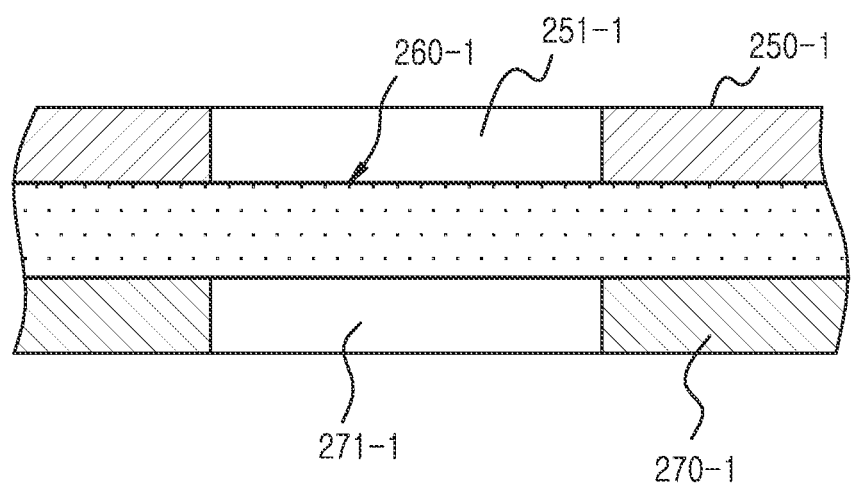

Referring to FIG. 11B, a reinforcement plate 260-1 is interposed between an outer layer 250-1 and an inner layer 270-1. The reinforcement plate 260-1 does not include a separate protruding window. Accordingly, a step, or ledge, as thick as openings 251-1 and 271-1 of the outer layer 250-1 and the inner layer 270-1 can be generated in the transparent window.

Figure 11C:
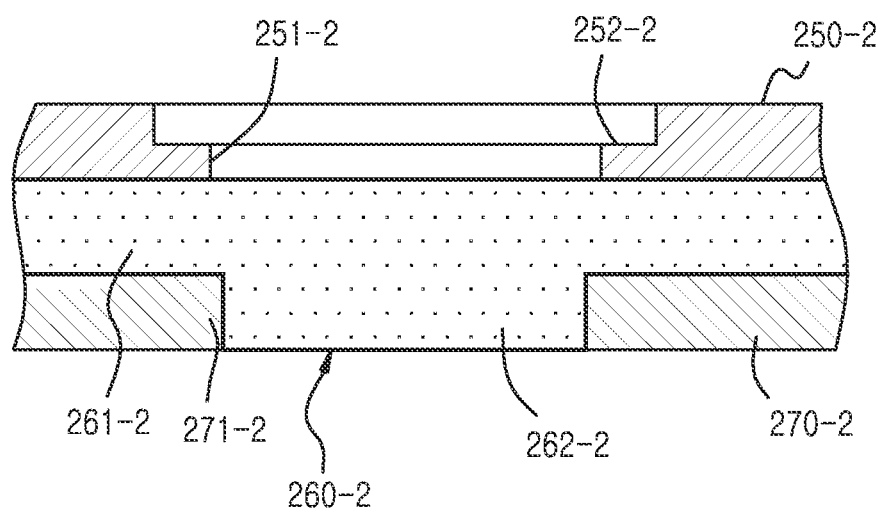

Referring to FIG. 11C, a reinforcement plate 260-2 is applied between an outer layer 250-2 and an inner layer 270-2. The reinforcement plate 260-2 includes only a window 262-2 protruding from a junction 261-2 by an opening 271-2 of the inner layer 270-2, and a step, or ledge, as deep as the opening of the outer layer 250-2. The external step can be reduced by forming the periphery of the step as a built-in part 252-2 which is adjacent to an opening 251-2 of the outer layer 250-2.

Figure 11D:
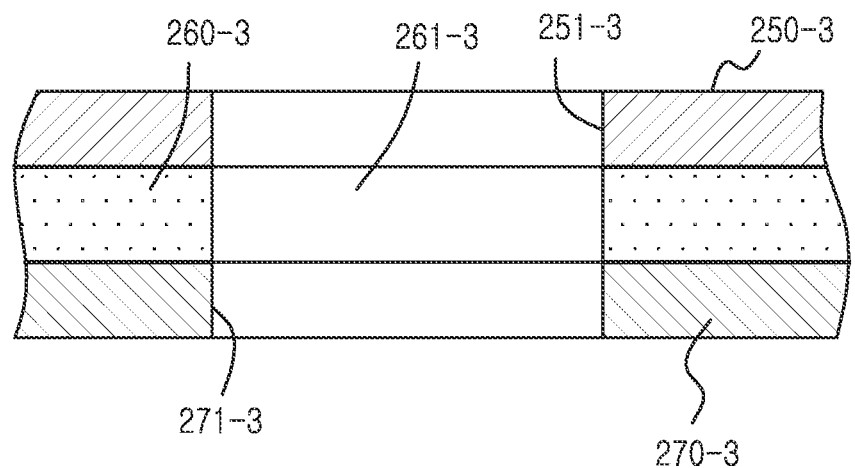

Referring to FIG. 11D, a reinforcement plate 260-3 is applied between an outer layer 250-3 and an inner layer 270-3, and includes an opening 261-3 in the same size as openings 251-3 and 271-3, respectively of the outer layer 250-3 and the inner layer 270-3. In this case, a separate window is absent. Hence, when the front cover of the protective case is closed, the touch screen of the electronic device can be directly exposed through the opening 261-3 of the reinforcement plate 260-3 and through the openings 251-3 and 271-3, respectively of the outer layer 250-3 and the inner layer 270-3.

Figure 11E:
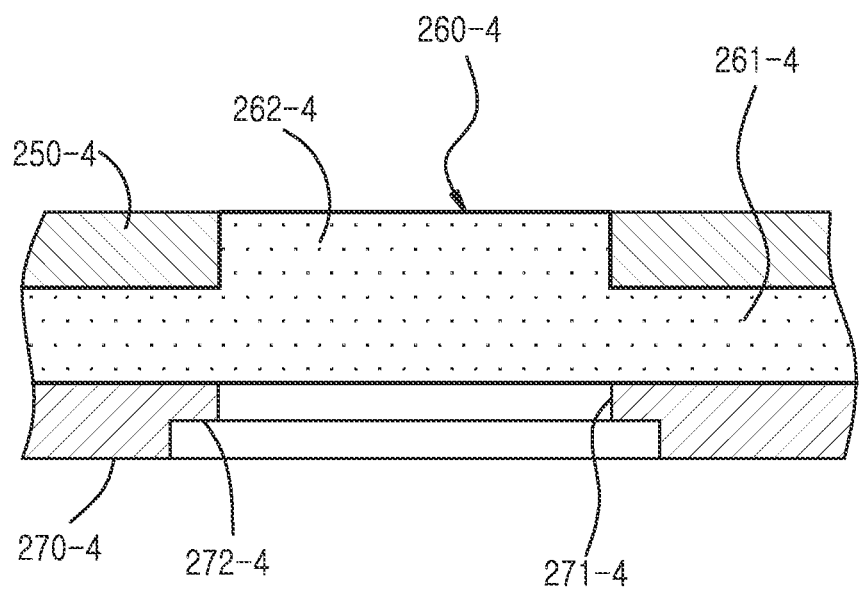

In FIG. 11E, a reinforcement plate 260-4 is applied between an outer layer 250-4 and an inner layer 270-4, and the reinforcement plate 260-4 includes only the window 262-4 protruding from a junction 261-4 by an opening of the outer layer 250-4, and includes a step as deep as an opening 271-4 of the inner layer 270-4. The step can be reduced by forming the periphery of the step as a built-in part 272-4. In this case, since the touch screen of the electronic device contacting the inner layer 270-4 does not directly contact the reinforcement plate 260-4, scratches on the touch screen, caused by the frequent opening and/or closing of the front cover, can be prevented in advance.

Figure 12:
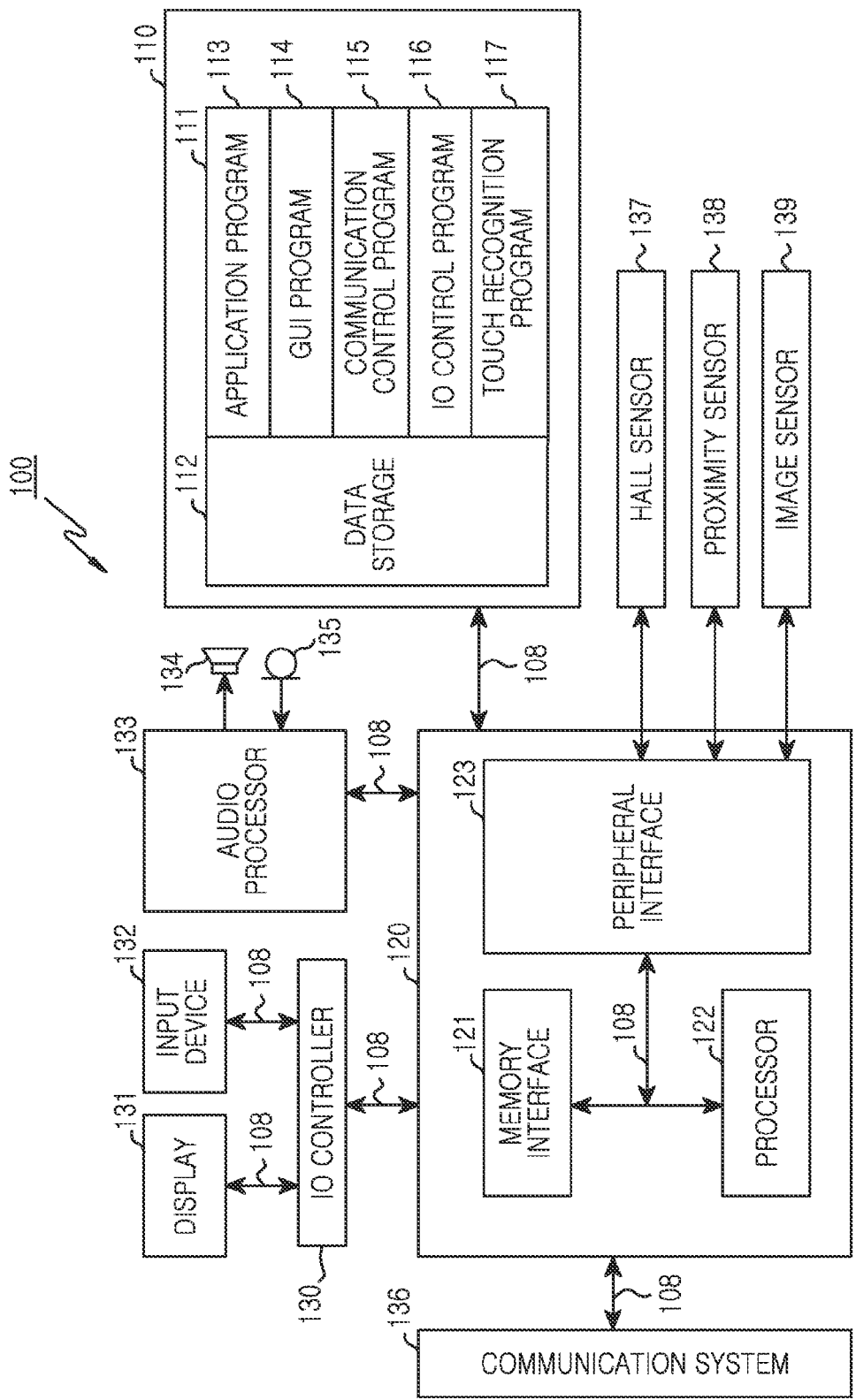
FIG. 12 is a block diagram of an electronic device according to an embodiment of the present disclosure.

FIG. 12 is a block diagram of an electronic device according to an embodiment of the present disclosure.

Referring to FIG. 12, the electronic device can detect an open/close state of the front cover of the protective case. For example, the magnetic force of the magnet disposed in the front cover of the protective case can be detected by, but not limited to, the Hall sensor disposed at the corresponding position of the electronic device. A proximity sensor of the electronic device may detect the open/close state of the front cover. An image sensor of the electronic device may detect the open/close state of the front cover. A detecting element of the electronic device may be installed to detect the target to detect in the front cover.

As shown in FIG. 12, the electronic device 100 can include a memory 110, a processor unit 120, an Input Output (10) controller 130, a display 131, an input device 132, an audio processor 133, and a communication system 136. These components can communicate with each other through at least one communication buses or signal lines 108.

The memory 110 includes a program storage 111 for storing a program to control operations of the electronic device 100, and a data storage 112 for storing data generated corresponding to the program execution. The memory 110 can store data generated by the program in a processor 122 or at any other similar and/or suitable storage location.

For example, the data storage 112 can include database information used for the processor 122 to determine related programs executed by a touch recognition control program 117, and setup information required to configure Graphic User Interface (GUI) when the display 131 displays the related programs.

The program storage 111 can include an application program 113, a GUI program 114, a communication control program 115, an IO control program 116, the touch recognition control program 117, and any other similar and/or suitable program that may be stored on the electronic device 100. Herein, the program contained in the program storage 111 may be referred as an instruction set which is a set of instructions.

The application program 113 can include at least one software component for at least one application program installed in the electronic device 100.

The GUI program 114 can include at least one software component for providing the GUI on the display 131. For example, the GUI program 114 may control to display application program information driven by the processor 122 on the display 131.

When the touch recognition control program 117 determines that a cover touch mode is to be entered and/or started, the GUI program 113 can control to display the display information only in the region of the display 131 corresponding to the transparent window of the front cover. When the touch recognition control program 117 enters the cover touch mode and determines touch information input through the upper portion of the front cover, the GUI program 113 may control to display the corresponding display information only in the region of the display 131 corresponding to the transparent window.

The communication control program 115 can include at least one software component for controlling communication with one or more other electronic devices using a communication system 136. For example, the communication control program 115 can discover other electronic device to communicate with using at least one of a Radio Frequency (RF) communication system, a wireless communication system, and/or a wired communication system. Upon discovering the other electronic device to communicate, the communication control program 115 sets the connection to communicate with the other electronic device. Next, the communication control program 115 may control to send and receive data to and from the other electronic device through the communication system 136 by performing capability discovery and session establishment with the other electronic device that is connected to the electronic device 100.

The IO control program 116 can display the operation of the electronic device 100 on the display 131, and can receive an operation command of the electronic device 100 from the outside through the input device 132.

The touch recognition control program 117 can include at least one software component for determining a corresponding function based on the touch information input to the upper portion of the front cover when the cover touch mode is activated under the control of the processor 122. The touch recognition control program 117 may include a software component for determining the corresponding function to display the display information only in the corresponding region of the transparent region of the display according to the cover touch mode.

The electronic device 100 can include one or more memories 110. According to a purpose, the memory 110 may function as the program storage 111, the data storage 112, or both. A physical internal area of the memory 110 may not be distinctly divided according to device characteristics.

The processor unit 120 can include a memory interface 121, at least one processor 122, and a peripheral interface 123. Herein, the memory interface 121, the at least one processor 122, and the peripheral interface 123 of the processor unit 120 can be integrated onto at least one integrated circuit, or any other similar and/or suitable hardware element, or implemented using separate components and/or hardware elements.

The memory interface 121 can control access of the component, such as the processor 122 or the peripheral interface 123, to the memory 110.

The peripheral interface 123 can control the connection between an input/output peripheral of the electronic device 100 and the processor 122 and the memory interface 121.

The processor 122 controls the electronic device 100 to provide various multimedia and communication services using at least one software program, to display the IO processor 130 to display the GUI of the electronic device on the display 131, and to forward the command input from the outside to the electronic device 100 to the input device 132. In so doing, the processor 122 can execute at least one program stored in the memory 110 and can control to provide the service according to the corresponding program.

The audio processor 133 can provide an audio interface between the user and the electronic device 100 through a speaker 134 and a microphone 135.

The communication system 136 can perform the communication function. For example, the communication system 136 may communicate with the other electronic device using at least one of mobile communication via a base station, infrared mobile communication (IrDA), short-range wireless communication, such as Bluetooth, wireless Local Area Network (LAN) communication, and wired communication.

The IO processor 130 can provide an interface between an IO device, such as the display 131 and input device 132, and the peripheral interface 123.

The input device 132 can provide input data, generated by a user's selection, to the processor unit 120 through the IO processor 130. For example, the input device 132 can include only a control button for controlling the electronic device 100. For example, the input device 132 may include a keypad for receiving the input data from the user.

The input device 132 can be included in the display 131 as, but not limited to, a touch screen. The touch screen can employ a capacitive touch screen and a resistive touch screen.

The display 131 displays status information of the electronic device 100, a character input by the user, a moving picture, and a still picture, which are received from the processor unit 120, through the IO processor 130, and any other similar and/or suitable information that may be displayed on the display 131. For example, the processor 122 can control to display, on the display 131, according to setup information corresponding to the touch recognition mode, i.e. the direct touch mode when the front cover is open or the cover touch mode when the front cover is closed, related to the program executed in the electronic device 100. The display 131 may be any suitable type of display unit, such as, but not limited to, a Light Emitting Diode (LED) display, an Organic LED display, a Liquid Crystal Display (LCD), a Thin-Film Transistor (TFT) display, and any other similar and/or suitable type of display.

Similar to the input device 132, when the display 131 is the touch screen, the single touch screen can function as both of the display 131 and the input device 132.

A Hall sensor 137 can be installed to detect the magnetic force of the magnet disposed in the front cover. When the front cover is closed, the Hall sensor 137 can detect the magnetic force of the magnet and provide the detection signal to the processor 122.

A proximity sensor 138 can detect the open/close state of the front cover. When the front cover is closed, the proximity sensor 137 can detect that the front cover approaches the touch screen, and can provide the detection signal to the processor 122.

The proximity sensor 138 can detect the open/close state of the front cover. When the front cover is closed, the proximity sensor 137 can detect that the front cover approaches the touch screen, and can provide the detection signal to the processor 122. When the front cover is closed, an image sensor 139 can detect that the front cover approaches the touch screen, and can provide the detection signal to the processor 122.

Figure 13:
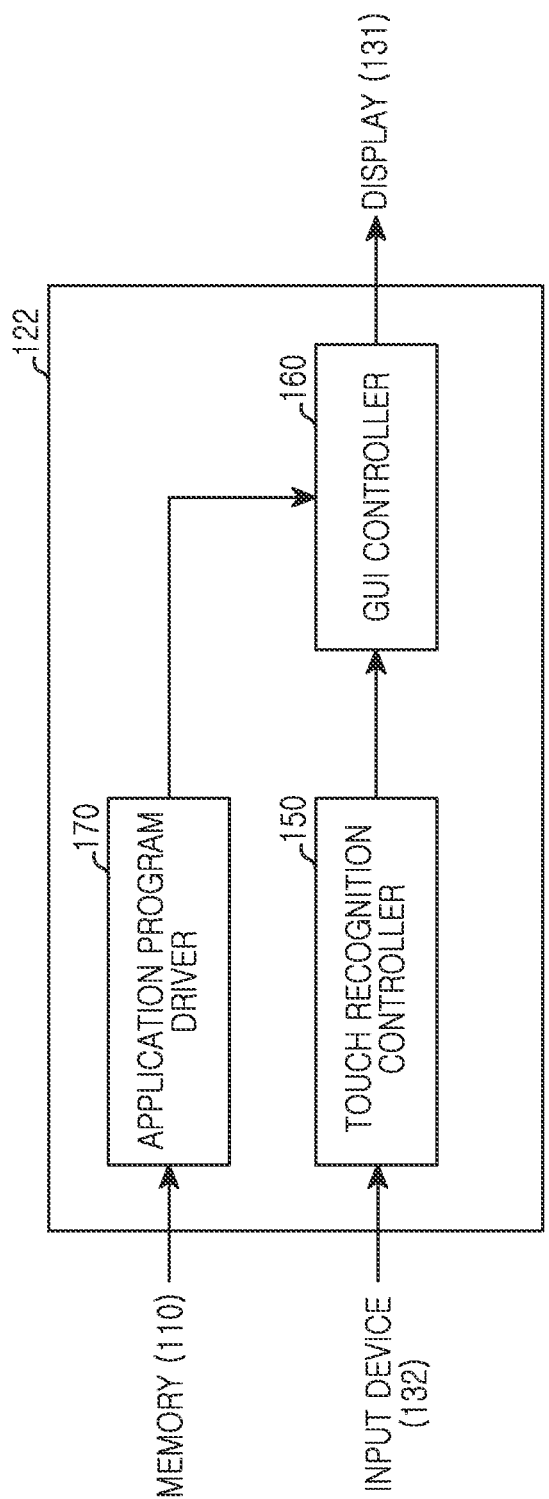
FIG. 13 is a block diagram of a processor of FIG. 12 according to an embodiment of the present disclosure.

FIG. 13 is a block diagram of a processor according to an embodiment of the present disclosure.

Referring to FIG. 13, the processor 122 can include a touch recognition controller 150, a GUI controller 160, and an application program driver 170.

The touch recognition controller 150 can execute the touch recognition control program 117 stored in the storage 110 and can determine the corresponding function according to a direct touch input or a cover touch input by taking into account a touch mode based on the open/close state of the front cover. In more detail, according to the signal detecting the closed front cover of the electronic device, the touch recognition controller 150 can display the information only at the position corresponding to the transparent window of the display 131. The touch recognition controller 150 may detect the manipulation of an external key button in a sleep mode and can control the GUI controller 160 to display the status information of the electronic device. Herein, the status information can include one or more basic information, such as remaining battery capacity information of the electronic device, weather information, time information, transmission and reception sensitivity information, and any other similar and/or suitable type of information. The status information may include information for receiving and confirming messages. The touch recognition controller 150 may change the touch mode according to the detection signal detecting the closed front cover. When the front cover is open, the touch recognition controller 150 may enter a detection mode for detecting the direct touch or the touch of a touch pen, or any other similar and/or suitable touch input device, on the touch screen. When the front cover is closed, the touch recognition controller 150 may switch to the cover touch mode for detecting the touch even on the upper portion of the front cover.

The GUI controller 160 executes the GUI program 114 stored in the program storage 111 and controls to display the GUI on the display 131. For example, the GUI controller 160 controls the display 131 to display the application program information driven by the application program driver 170. For example, when the touch recognition controller 150 determines the cover touch mode, the GUI controller 160 can control to display the display information only in the region corresponding to the transparent window of the front cover of the display 131.

The application program driver 170 can execute the at least one application program 113 stored in the program storage 111 and can provide a service according to the corresponding application program.

Alternatively, the electronic device 100 may include a separate control module for determining the touch function according to the touch information.

Figure 14:
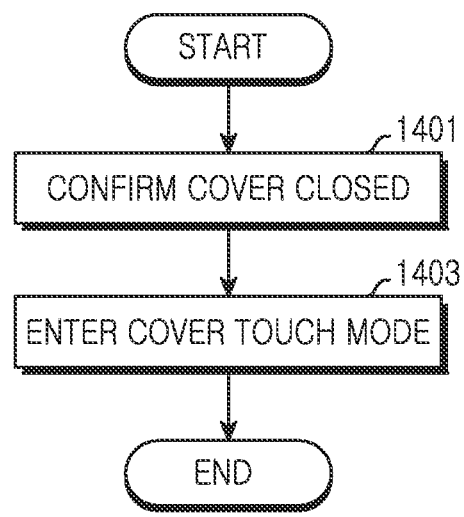
FIG. 14 is a flowchart of a method for operating an electronic device according to an embodiment of the present disclosure.

FIG. 14 is a flowchart of a method for operating an electronic device according to an embodiment of the present disclosure.

Referring to FIG. 14, the electronic device confirms that the cover is closed in operation 1401. Herein, confirmation that the cover is closed can indicate that the front cover of the protective case of the electronic device is closed so as to overlap the upper portion of the touch screen. When the front cover is closed, the electronic device can detect that the front cover is closed according to the detection signal which detects the target of the cover using the detecting element. For example, the target can be the magnet disposed at the position of the front cover, and the detecting element can be the Hall sensor or the reed switch disposed at a corresponding position of the electronic device so as to detect the target of the cover.

Figure 16A:
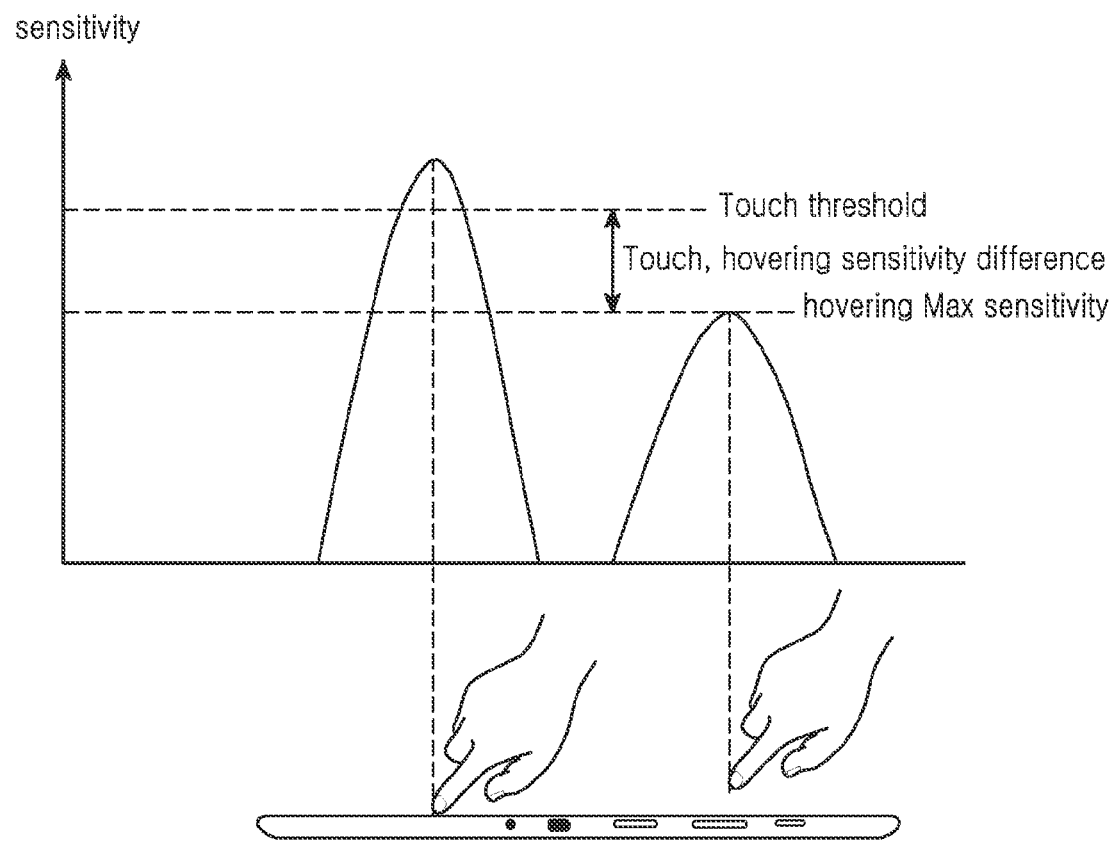
FIGS. 16A and 16B are graphs of sensitivity compared between a direct touch mode and a cover touch mode of an electronic device according to an embodiment of the present disclosure.
Figure 16B:
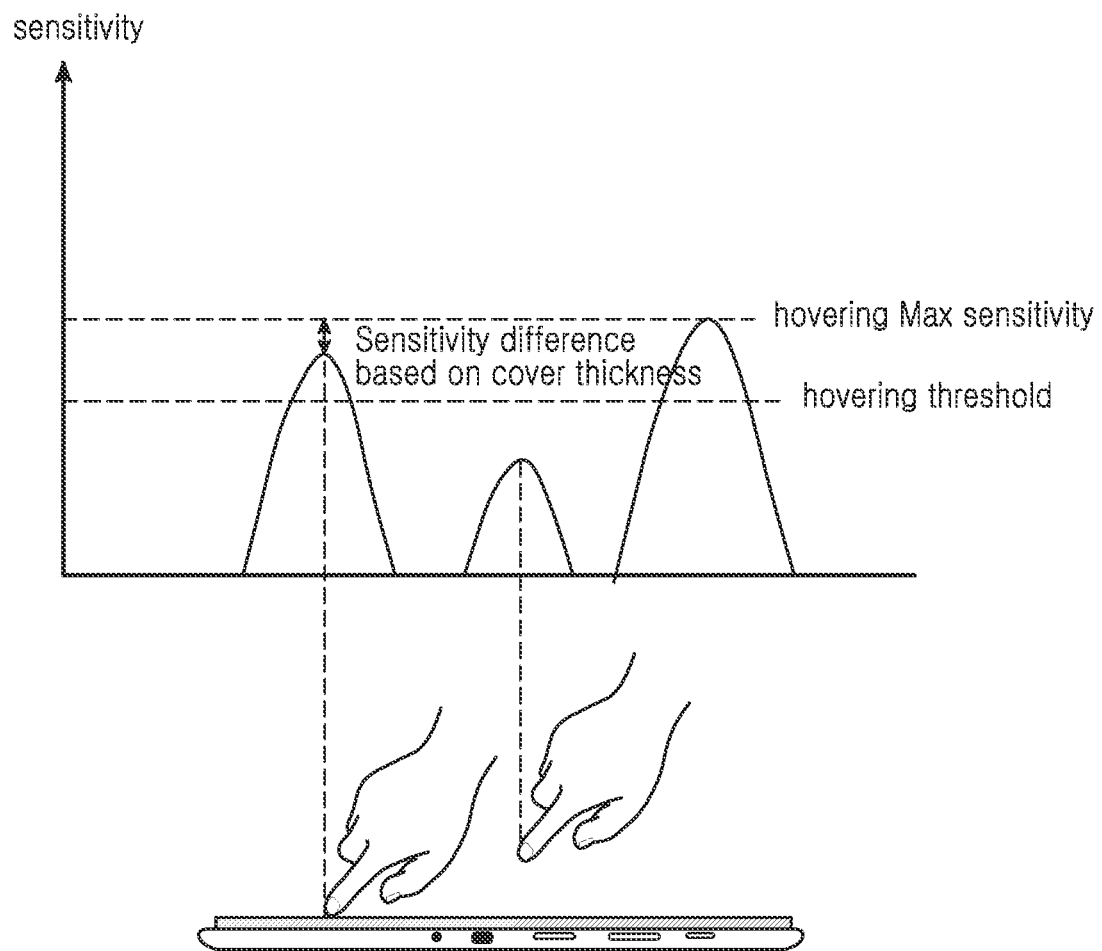

In operation 1403, the electronic device enters the cover touch mode. The cover touch mode detects the touch input to the upper portion of the front cover when the front cover is closed. In this mode, a reference sensitivity value of the touch screen can be changed as shown in FIGS. 16A and 16B. FIGS. 16A and 16B depict the operation sensitivity of the touch screen and a change of the operation mode according to the open/close state of the front cover. For example, when detecting a touch over a certain hovering sensitivity in the cover touch mode, the electronic device can control to recognize the hovering input. Next, the electronic device finishes this process.

Figure 15:
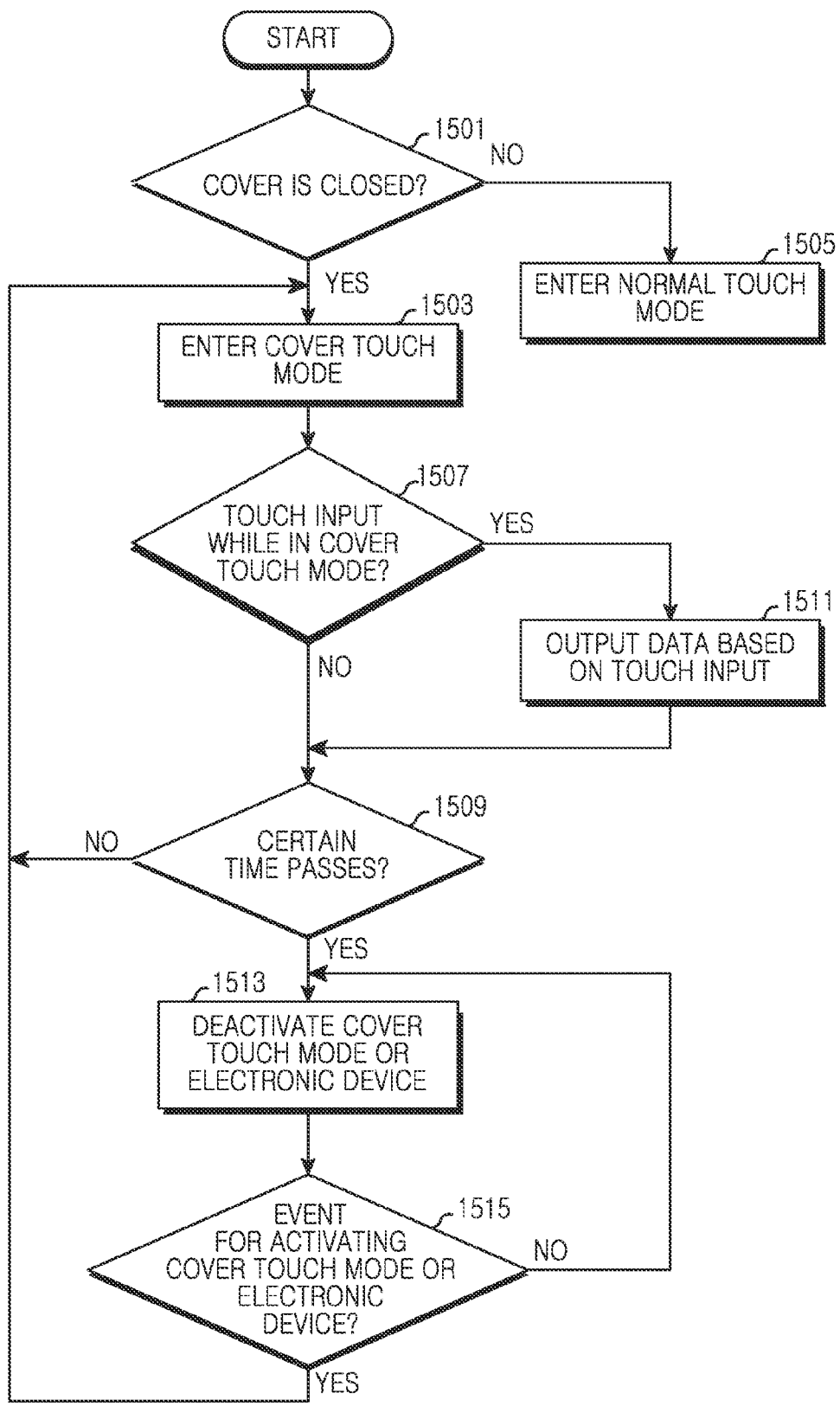
FIG. 15 is a flowchart of a method for operating a cover touch of an electronic device according to an embodiment of the present disclosure.

FIG. 15 is a flowchart of a method for operating the cover touch of the electronic device according to an embodiment of the present disclosure.

Referring to FIG. 15, the electronic device can determine whether the cover is closed in operation 1501. When the cover is closed, the electronic device can enter the cover touch mode in operation 1503. Herein, the cover touch mode can detect the touch input to the upper portion of the closed front cover and display the corresponding status information on the touch screen, which is the display. For example, when entering the cover touch mode and detecting the touch over the certain hovering sensitivity, the electronic device can recognize the hovering input. The cover touch mode can display the status information of the electronic device only in the touch screen region corresponding to the transparent window of the front cover. The status information can include at least one basic information, for example, but not limited to, the remaining battery capacity information of the electronic device, the weather information, the time information, and the transmission and reception sensitivity information. The status information may include the information for receiving and confirming messages.

When the electronic device determines that the cover is not closed, in operation 1501, then the electronic device enters a normal touch mode in operation 1505. The normal touch mode can be the touch mode according to the direct contact for inputting the data by directly touching the user's finger or the touch pen/stylus on the touch screen. The normal touch mode can include the direct touch of the touch screen by detecting a pen touch panel (digitizer) separated from the touch panel of the touch screen in the electronic device, and the hovering input apart from the touch screen. For example, the hovering input can be the touch for preview in the normal touch mode with the front cover opened.

In operation 1507, the electronic device can determine whether there is the touch input while in the cover touch mode. The electronic device can detect the user's touch input to the upper portion of the closed front cover. The touch input can be preset in the electronic device. In operation 1511, if the electronic device determines that there is the touch input while in the cover touch mode in operation 1507, then the electronic device can output the corresponding function according to the touch input. The corresponding function can output various status information of the electronic device displayed on the touch screen through the transparent window of the front cover. The corresponding function can output sound information, such as voice and sound, of the electronic device. The corresponding function can output haptic information, such as vibration of the electronic device. The electronic device may control to conduct the corresponding function of the touch input even outside the window of the front cover in the cover touch mode. For example, when the call is received, the electronic device can perform the corresponding function by touching, e.g. dragging, the front cover region corresponding to the preset touch region for the call reception according to the user's experience.

When the touch input is not detected in the cover touch mode in operation 1507, then the electronic device can determine whether a certain time passes, or in other words, can determine whether a predetermined amount of time has elapsed, in operation 1509. When the certain time does not pass, the electronic device goes to operation 1503.

When the electronic device has determined that the certain time passes in operation 1509, the electronic device can deactivate the cover touch mode or the electronic device in operation 1513. While the touch can be input to the closed front cover of the protective case, such a touch mostly arises when the user grips and carries the electronic device in the user's hand. When the cover touch mode continues even after the certain time, then the electronic device, which is held in the user's hand to carry, can recognize the cover touch, i.e. can determine that the cover touch has occurred, and can perform an unintended function. The unintended touch input may be excluded by defining the touch input in the cover touch mode as a particular operation, for example, as an undetectable operation using a grip sensor or a proximity sensor when the user holds the electronic device in his/her hand.

Even when the cover touch mode is deactivated, the electronic device can determine whether an event for activating the cover touch mode or the electronic device is generated in operation 1515. For example, when receiving information and/or a message in the sleep mode, the electronic device can reactivate the cover touch mode, so as to return to operation 1503, by displaying the corresponding information in the touch screen region corresponding to the transparent window of the front cover so as to notify the information to the user. The received message can be, but is not limited to, a text message received from the other electronic device or any other similar and/or suitable type of received message. The received information can be a notification message provided from other service provider. The received information can be various output request information, such as a notification message, a notification sound, a notification vibration, and any other similar and/or suitable type of notification provided in the electronic device. Even when the cover touch mode is deactivated, the electronic device can reactivate the cover touch mode by detecting the user's input of the key button on the exterior of the electronic device.

FIGS. 16A and 16B are graphs of sensitivity compared between a direct touch mode and a cover touch mode of an electronic device according to an embodiment of the present disclosure.

Referring to FIGS. 16A and 16B, FIG. 16A shows a graph illustrating sensitivity of the electronic device in the direct touch mode and FIG. 16B shows a graph illustrating sensitivity of the electronic device in the cover touch mode.

As set forth above, when the protective cover of the electronic device is closed, the user can confirm the status information of the electronic device and/or control the electronic device.

While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:

1. A cover comprising:
   a protective case for selectively covering a display of an electronic device;
   a window formed in the protective case for exposing a part of the display;
   a magnet for indicating a position of the cover with respect to the display;
   a connector for detachably connecting the cover to the electronic device; and
   a shield unit for selectively blocking the magnet from indicating the position of the cover, the shield unit being disposed at a position overlapping with the magnet.

2. The cover of claim 1, wherein the window comprises a plate which is partially transparent or translucent.

3. The cover of claim 1, further comprising at least one magnet embedded in the cover.

4. The cover of claim 1, further comprising an electronic integrated circuit (IC) chip embedded in the cover.

5. The cover of claim 1, wherein the protective case comprises:
   a first layer;
   a second layer; and
   a third layer that has a portion interposed between the first layer and the second layer,
   wherein the first layer and the second layer each comprise an opening at a position for forming the window, and
   wherein the third layer further comprises a portion which is at least partially transparent or translucent to form the window.

6. The cover of claim 5, further comprising:
   a linking part for interconnecting the connector and the cover,
   wherein the linking part has at least one of bendability, tension, stiffness, and flexibility of a selected value.

7. The cover of claim 6,
   wherein the third layer is disposed between a periphery of the first layer and a periphery of the second layer,
   wherein the third layer is interposed between the first layer and the second layer, and
   wherein the third layer is formed of a material imparting at least one of the bendability, the tension, the stiffness, and the flexibility of the selected value.

8. The cover of claim 5, wherein a periphery of the first layer is attached to a periphery of the second layer.

9. The cover of claim 1, wherein the connector is a battery cover capable of covering an embedded battery of the electronic device.

10. The cover of claim 1, wherein the connector is capable of covering at least one side of an external housing of the electronic device.

11. The cover of claim 1,
    wherein the magnet is detachable from the electronic device.

12. An electronic device comprising:
    a body;
    a display;
    a rear cover detachable from the body;
    a front cover for folding with the rear cover and covering the display;
    a linking part configured to interconnect the front cover and the rear cover; and
    a window disposed in the front cover for exposing a part of the display,
    wherein the front cover comprises:
      an inner layer configured to form a face for contacting the display,
      a magnet for indicating a position of the front cover with respect to the display,
      a shield unit for selectively blocking the magnet from indicating the position of the front cover, the shield unit being disposed at a position overlapping with the magnet, and
      a plate interposed between the inner layer and an outer layer.

* * * * *